(12) United States Patent
Isobe et al.

(10) Patent No.: US 7,785,947 B2
(45) Date of Patent: Aug. 31, 2010

(54) METHOD FOR MANUFACTURING SEMICONDUCTOR DEVICE COMPRISING THE STEP OF FORMING NITRIDE/OXIDE BY HIGH-DENSITY PLASMA

(75) Inventors: Atsuo Isobe, Atsugi (JP); Satoshi Murakami, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 561 days.

(21) Appl. No.: 11/410,188

(22) Filed: Apr. 25, 2006

(65) Prior Publication Data

US 2006/0246644 A1 Nov. 2, 2006

(30) Foreign Application Priority Data

Apr. 28, 2005 (JP) .............................. 2005-133688

(51) Int. Cl.
  *H01L 21/336* (2006.01)
(52) U.S. Cl. ................................................. 438/197
(58) Field of Classification Search .................. 438/197
  See application file for complete search history.

(56) References Cited

U.S. PATENT DOCUMENTS

| 4,727,044 A | 2/1988 | Yamazaki |
| 5,485,019 A | 1/1996 | Yamazaki et al. |
| 5,757,456 A | 5/1998 | Yamazaki et al. |
| 5,956,581 A | 9/1999 | Yamazaki et al. |
| 6,127,199 A | 10/2000 | Inoue et al. |
| 6,217,721 B1* | 4/2001 | Xu et al. ................ 204/192.17 |
| 6,235,563 B1 | 5/2001 | Oka et al. |
| 6,297,103 B1 | 10/2001 | Ahn et al. |
| 6,368,988 B1* | 4/2002 | Li et al. ........................ 438/792 |
| 6,426,245 B1 | 7/2002 | Kawasaki et al. |

(Continued)

FOREIGN PATENT DOCUMENTS

EP 1505641 A 2/2005

(Continued)

OTHER PUBLICATIONS

Lu et al. "Dual-metal gate technology for deep-submicron CMOS transistors", 2000 Symposium on VLSI Technology Digest of Technical Papers, p. 72-73.*

(Continued)

*Primary Examiner*—Ha Tran T Nguyen
*Assistant Examiner*—Karen M Kusumakar
(74) *Attorney, Agent, or Firm*—Eric J. Robinson; Robinson Intellectual Property Law Office, P.C.

(57) ABSTRACT

In order to manufacture a highly reliable and compact TFT, it is an object of the present invention to provide a method for manufacturing a semiconductor device for forming a gate electrode, a source wiring and a drain wiring with high reliability, and a semiconductor device. In the method for manufacturing a semiconductor device, a semiconductor film is formed over a substrate having an insulated surface, a gate insulating film is formed over the semiconductor film, a gate electrode is formed over the gate insulating film, and a nitride film is formed over the surface of the gate electrode by nitriding the surface of the gate electrode by using high-density plasma.

48 Claims, 18 Drawing Sheets

U.S. PATENT DOCUMENTS

| | | | |
|---|---|---|---|
| 6,519,136 B1 | 2/2003 | Chu et al. | |
| 6,521,912 B1* | 2/2003 | Sakama et al. | 257/57 |
| 6,534,421 B2 | 3/2003 | Kakkad | |
| 6,534,826 B2 | 3/2003 | Yamazaki | |
| 6,548,380 B1* | 4/2003 | Goto et al. | 438/485 |
| 6,555,420 B1 | 4/2003 | Yamazaki | |
| 6,716,761 B2 | 4/2004 | Mitsuiki | |
| 6,773,996 B2 | 8/2004 | Suzawa et al. | |
| 6,818,852 B2 | 11/2004 | Ohmi et al. | |
| 6,919,282 B2 | 7/2005 | Sakama et al. | |
| 6,975,018 B2 | 12/2005 | Ohmi et al. | |
| 7,081,640 B2 | 7/2006 | Uchida et al. | |
| 7,226,874 B2 | 6/2007 | Matsuyama et al. | |
| 7,303,945 B2 | 12/2007 | Seko et al. | |
| 2001/0007362 A1* | 7/2001 | Ha et al. | 257/154 |
| 2001/0010377 A1* | 8/2001 | Cuchiaro et al. | 257/295 |
| 2001/0012663 A1* | 8/2001 | Magri' et al. | 438/267 |
| 2001/0013657 A1* | 8/2001 | Anand | 257/758 |
| 2001/0044196 A1* | 11/2001 | Miyazaki et al. | 438/585 |
| 2002/0020497 A1 | 2/2002 | Ohmi et al. | |
| 2002/0028543 A1* | 3/2002 | Yamazaki et al. | 438/154 |
| 2002/0076947 A1* | 6/2002 | Li et al. | 438/788 |
| 2002/0164883 A1* | 11/2002 | Ohmi et al. | 438/726 |
| 2003/0008501 A1* | 1/2003 | Bakli et al. | 438/653 |
| 2003/0148568 A1* | 8/2003 | Ohmi et al. | 438/200 |
| 2004/0007748 A1 | 1/2004 | Sakama et al. | |
| 2004/0050494 A1 | 3/2004 | Ohmi et al. | |
| 2004/0097067 A1* | 5/2004 | Kim et al. | 438/622 |
| 2004/0129673 A1 | 7/2004 | Belyansky et al. | |
| 2004/0171216 A1 | 9/2004 | Ohmi et al. | |
| 2004/0217431 A1 | 11/2004 | Shimada | |
| 2005/0057136 A1 | 3/2005 | Moriya et al. | |
| 2005/0062407 A1 | 3/2005 | Suh et al. | |
| 2005/0084994 A1 | 4/2005 | Yamazaki et al. | |
| 2005/0158665 A1 | 7/2005 | Maekawa et al. | |
| 2005/0196973 A1 | 9/2005 | Suzuki et al. | |
| 2005/0208779 A1* | 9/2005 | Klauk et al. | 438/795 |
| 2005/0263835 A1 | 12/2005 | Sakama et al. | |
| 2005/0285102 A1 | 12/2005 | Koo et al. | |
| 2006/0014351 A1* | 1/2006 | Lo et al. | 438/305 |
| 2006/0033107 A1 | 2/2006 | Lee et al. | |
| 2006/0055314 A1 | 3/2006 | Nakamura et al. | |
| 2006/0121694 A1 | 6/2006 | Tamura | |
| 2006/0154492 A1 | 7/2006 | Ide et al. | |
| 2006/0244063 A1 | 11/2006 | Isobe et al. | |
| 2006/0246633 A1 | 11/2006 | Arai et al. | |
| 2006/0246640 A1 | 11/2006 | Kuwashima et al. | |
| 2006/0246738 A1 | 11/2006 | Isobe et al. | |
| 2006/0270066 A1 | 11/2006 | Imahayashi et al. | |
| 2008/0032511 A1 | 2/2008 | Kabe et al. | |

FOREIGN PATENT DOCUMENTS

| | | |
|---|---|---|
| EP | 1 617 483 | 1/2006 |
| EP | 1 622 194 | 2/2006 |
| JP | 06-013615 | 1/1994 |
| JP | 08-254686 | 10/1996 |
| JP | 10-125929 | 5/1998 |
| JP | 2000-174277 | 6/2000 |
| JP | 2001-135824 | 5/2001 |
| JP | 2002-217170 | 8/2002 |
| JP | 2002-261091 | 9/2002 |
| JP | 2004-319952 | 11/2004 |
| JP | 2005-093737 | 4/2005 |
| KR | 2001-0048116 A | 6/2001 |
| WO | WO 2004/017396 | 2/2004 |
| WO | WO 2005/004223 | 1/2005 |

OTHER PUBLICATIONS

*The Advancing Introduction of Plasma Oxynitriding Apparatus Adopted by More Than 10 LSI Makers*, Nikkei Microdevices, Apr. 2005, pp. 100-103.

"Office Action (Application No. 200610079300.9) Dated Aug. 21, 2009".

Office Action (Application No. 200610079300.9) dated Mar. 26, 2010.

* cited by examiner

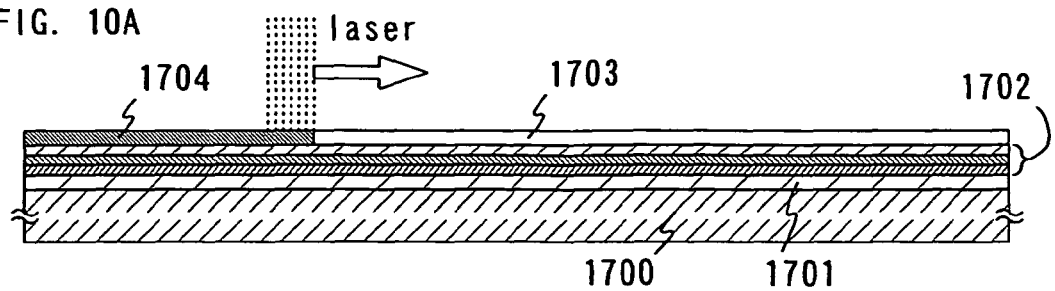
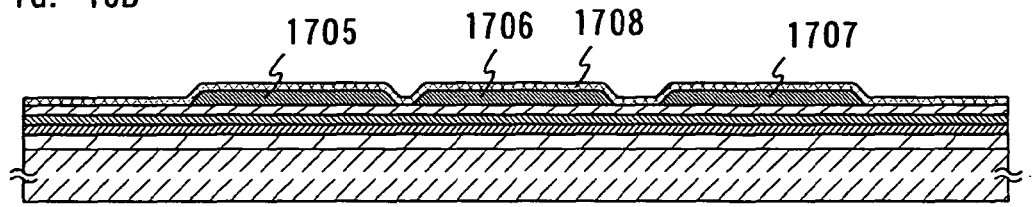
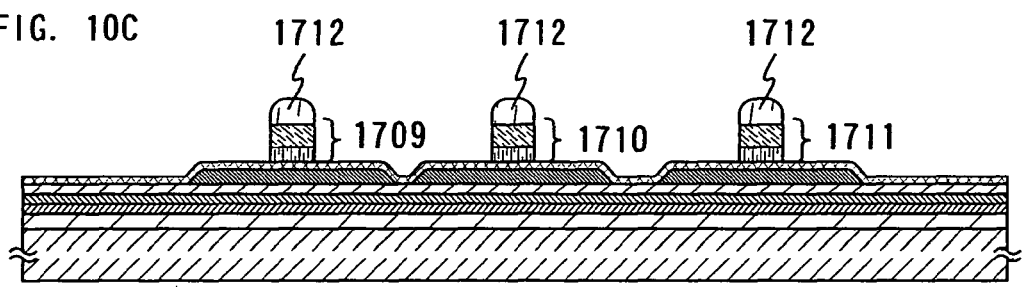
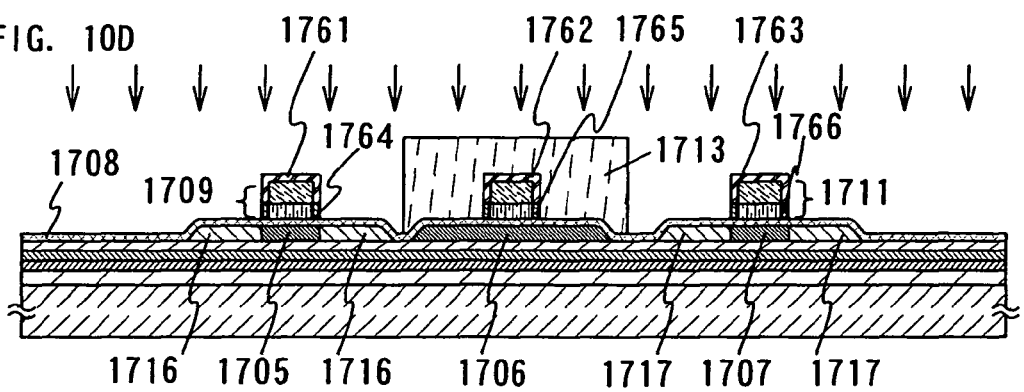
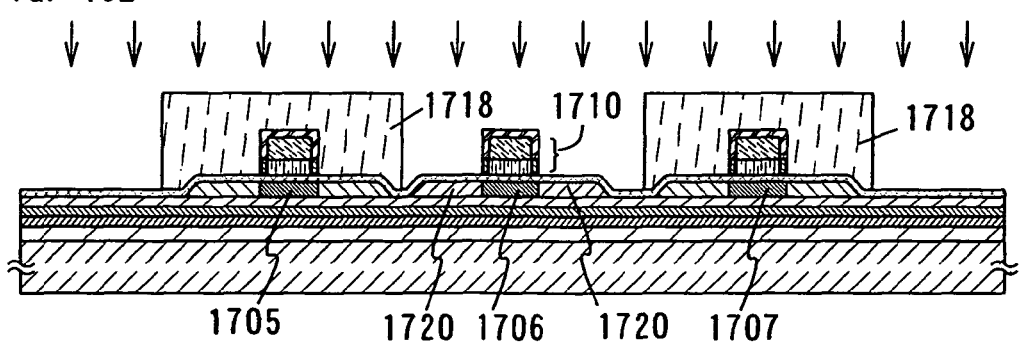

METHOD FOR MANUFACTURING SEMICONDUCTOR DEVICE COMPRISING THE STEP OF FORMING NITRIDE/OXIDE BY HIGH-DENSITY PLASMA

BACKGROUND OF THE INVENTION

1. Field of the Invention

The present invention relates to a method for manufacturing a semiconductor device, particularly a method for manufacturing a semiconductor device using a high-density plasma apparatus in a manufacturing step of a semiconductor element (device) such as a thin film transistor.

2. Description of the Related Art

In recent years, a technique for forming a thin film transistor (TFT) by using a semiconductor thin film (a thickness of around several nanometers to several hundred nanometers) formed over a substrate having an insulated surface such as glass has been attracting attention. The thin film transistor is broadly applied to semiconductor devices such as an IC and an electro-optic device. In accordance with demands for a more compact and much higher performance semiconductor device, a development of a much higher performance thin film transistor having a minute structure is required. In order to manufacture a much higher performance and more compact thin film transistor, a gate electrode, a source wiring and a drain wiring, and the like with much higher reliability are required to be manufactured. For example, reliability of a TFT is improved by forming a protective film over a surface of a gate electrode to improve a heat resistant property of the gate electrode (For example, Patent Document 1).

[Patent Document 1]
    Japanese Patent Application Laid-Open No.: H6-13615

As described in Patent Document 1, a nitride film such as a titanium nitride (TiN) film is formed over a gate electrode, and a source wiring and a drain wiring by a sputtering method, and a heat resistant property of the gate electrode, and the source wiring and the drain wiring is improved and oxidation is prevented. However, since the nitride film formed by a CVD method or a sputtering method has a defect inside the film and film quality is not sufficient, there is a concern that reliability of a TFT be lowered.

SUMMARY OF THE INVENTION

In view of the forgoing problems, it is an object of the present invention to provide a method for manufacturing a semiconductor device, in which reliability of a gate electrode, and a source wiring and a drain wiring is improved, and a highly reliable TFT is intended to be manufactured. Further, it is also an object of the present invention to provide a method for manufacturing a semiconductor device intended to reduce a display defect of a display device.

According to one feature of the present invention, a method for manufacturing a semiconductor device includes the steps of forming a semiconductor film over a substrate having an insulated surface, forming a gate insulating film over the semiconductor film, forming a gate electrode over the gate insulating film, and forming a nitride film over the surface of the gate electrode by nitriding the surface of the gate electrode by high-density plasma.

According to another feature of the present invention, a method for manufacturing a semiconductor device includes the steps of forming a semiconductor film including a source region and a drain region over a substrate having an insulated surface, forming a gate insulating film over the semiconductor film, forming a gate electrode over the gate insulating film, forming a nitride film over the surface of the gate electrode by nitriding the surface of the gate electrode by high-density plasma, forming an insulating film over the gate electrode, forming a wiring connected to the source region or the drain region over the insulating film, and forming a metal nitride film or a metal oxide film over the surface of the wiring by nitriding or oxidizing the surface of the wiring by high-density plasma.

According to another feature of the present invention, a method for manufacturing a semiconductor device includes the steps of forming a semiconductor film including a source region and a drain region over a substrate having an insulated surface, forming a gate insulating film over the semiconductor film, forming a gate electrode over the gate insulating film, forming a nitride film over the surface of the gate electrode by nitriding the surface of the gate electrode by high-density plasma, forming a first insulating film over the gate electrode, forming a wiring connected to the source region or the drain region over the first insulating film, forming a metal nitride film or a metal oxide film over the surface of the wiring by nitriding or oxidizing the surface of the wiring by high-density plasma, forming a second insulating film over the metal nitride film or the metal oxide film, forming a transparent conductive film over the second insulating film, and nitriding or oxidizing the transparent conductive film and the second insulating film by high-density plasma.

According to another feature of the present invention, a method for manufacturing a semiconductor device includes the steps of forming a semiconductor film including a source region and a drain region over a substrate having an insulated surface, forming a gate insulating film over the semiconductor film, forming a gate electrode over the gate insulating film, forming a nitride film over the surface of the gate electrode by nitriding the surface of the gate electrode by high-density plasma, forming a first insulating film over the gate electrode, forming a wiring connected to the source region or the drain region over the first insulating film, forming a metal nitride film or a metal oxide film over the surface of the wiring by nitriding or oxidizing the surface of the wiring by high-density plasma, forming a second insulating film over the metal nitride film or the metal oxide film, forming a transparent conductive film over the second insulating film, nitriding or oxidizing the transparent conductive film and the second insulating film by high-density plasma, and cleaning the surface of the transparent conductive film.

In the method for manufacturing a semiconductor device of the present invention, a mixed gas of oxygen and a rare gas, or a mixed gas of oxygen, hydrogen, and a rare gas is used in oxidation by using the high-density plasma.

In the method for manufacturing a semiconductor device of the present invention, a mixed gas of nitrogen and a rare gas, a mixed gas of ammonia and a rare gas, or a mixed gas of nitrogen, hydrogen, and a rare gas is used in nitriding by using the high-density plasma.

In the method for manufacturing a semiconductor device of the present invention, the substrate is heated to temperatures of 200 to 550° C. in nitriding or oxidation by using the high-density plasma.

In the method for manufacturing a semiconductor device of the present invention, the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

In the method for manufacturing a semiconductor device of the present invention, a material for the gate electrode is molybdenum, tungsten, chromium, tantalum, aluminum, or silicon.

According to one feature of the present invention, a semiconductor device includes a semiconductor film over a substrate having an insulated surface, a gate insulating film over the semiconductor film, a gate electrode over the gate insulating film, and a nitride film containing a rare gas formed by high-density plasma over the surface of the gate electrode.

According to another feature of the present invention, a semiconductor device includes a semiconductor film including a source region and a drain region over a substrate having an insulated surface, a gate insulating film over the semiconductor film, a gate electrode over the gate insulating film, a nitride film containing a rare gas formed by high-density plasma over the surface of the gate electrode, an insulating film over the gate electrode, a wiring connected to the source region or the drain region over the insulating film, and a metal nitride film or a metal oxide film containing a rare gas formed by high-density plasma over the surface of the wiring.

According to another feature of the present invention, a semiconductor device includes a semiconductor film including a source region and a drain region over a substrate having an insulated surface, a gate insulating film over the semiconductor film, a gate electrode over the gate insulating film, a nitride film containing a rare gas formed by high-density plasma over the surface of the gate electrode, a first insulating film over the gate electrode, a wiring connected to the source region or the drain region over the first insulating film, a metal nitride film or a metal oxide film containing a rare gas formed by high-density plasma over the surface of the wiring, a second insulating film over the metal nitride film or the metal oxide film containing a rare gas, a transparent conductive film over the second insulating film, and a nitride film or an oxide film containing a rare gas formed by high-density plasma over the transparent conductive film and the second insulating film.

In addition, the present invention provides an EL display device, a liquid crystal display device, or an RFID including the semiconductor device.

A surface of a gate electrode is covered with a dense nitride film by nitriding the surface of the gate electrode by high-density plasma produced in a high-density plasma apparatus, and thus, a heat resistant property of the gate electrode can be improved and the gate electrode can be prevented from being oxidized. Furthermore, since the nitride film formed by high-density plasma produced in the high-density plasma apparatus is a dense film with less plasma damage, reliability of a semiconductor device can be improved.

A surface of a wiring is covered with a dense nitride film or oxide film by nitriding or oxidizing the surface of the wiring by high-density plasma produced in a high-density plasma apparatus, and thus, a heat resistant property of the wiring can be improved and disconnection of the wiring can be prevented. Furthermore, since the nitride film or the oxide film formed by high-density plasma produced in the high-density plasma apparatus is a dense film with less plasma damage, reliability of a semiconductor device can be improved.

By nitriding or oxidizing a surface of a pixel electrode by high-density plasma produced in a high-density plasma apparatus, the surface can be reformed without damage due to plasma. Therefore, reliability of a display device can be improved.

These and other objects, features and advantages of the present invention will become more apparent upon reading of the following detailed description along with the accompanied drawings.

BRIEF DESCRIPTION OF THE DRAWINGS

In the accompanying drawings:

FIGS. 10A to 10E are views each showing a manufacturing step of a semiconductor device according to the present invention;

DESCRIPTION OF THE INVENTION

Figure 1A:
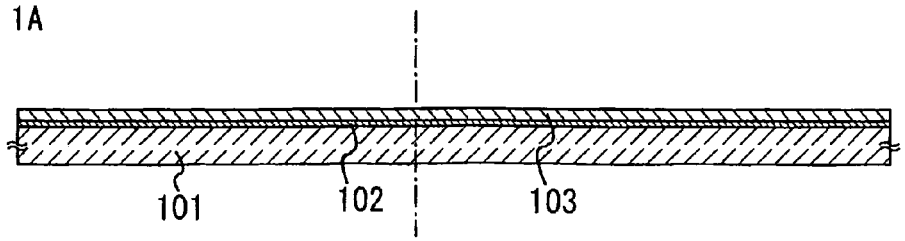
FIGS. 1A to 1E are views each showing a manufacturing step of a semiconductor device according to the present invention.

Embodiment Modes of the present invention will be described with reference to the accompanying drawings. It is to be noted that the present invention is not limited to the following embodiment modes, and it is to be easily understood by those skilled in the art that modes and details thereof can be modified in various ways without departing from the spirit and the scope of the invention. Therefore, the present invention should not be interpreted as being limited to the description of the following embodiment modes. Further, in the structure of present invention, the same reference numerals are used for the same portions or portions having the same functions in different drawings, and an explanation thereof will be omitted. In addition, Embodiment Modes 1 to 9 can be freely combined.

Embodiment Mode 1

In this embodiment mode, steps of manufacturing a TFT by using a high-density plasma apparatus will be described with reference to FIGS. 1A to 1E, 2A to 2D, and 15.

First, as shown in FIG. 1A, a base film 102 is formed over an insulating substrate 101. The insulating substrate 101 can be, for example, a glass substrate such as barium borosilicate glass or alumino borosilicate glass, a quartz substrate, a ceramic substrate, or the like. In addition, a substrate formed of a synthetic resin having flexibility such as a plastic can also be used as long as it can resist a processing temperature in a manufacturing step, although such a substrate generally tends to have a low allowable temperature limit compared with the above substrates. The surface of the insulating substrate 101 may be polished by a CMP method or the like to be planarized. When a glass substrate is used as the insulating substrate 101, the surface of the glass substrate may be nitrided using a high-density plasma apparatus, and a silicon nitride film may be formed over the glass substrate. The silicon nitride film that is formed by nitriding using the high-density plasma apparatus can be used as a part of the base film.

As a method for forming the base film 102, a known method such as a CVD method typified by a plasma CVD method or a low pressure CVD method, or a sputtering method may be used. In addition, as the base film, a single layer structure using any one of a silicon oxide film, a silicon nitride film, a silicon oxynitride film, and a silicon nitride oxide film, or a structure in which these films are appropriately stacked may be employed. In this specification, silicon oxynitride is a substance in which a composition ratio of oxygen is higher than that of nitrogen and can also be referred to as silicon oxide containing nitrogen. Further, in this specification, silicon nitride oxide is a substance in which a composition ratio of nitrogen is higher than that of oxygen and can also be referred to as silicon nitride containing oxygen. In this embodiment mode, a silicon nitride oxide film of 50 nm thick and a silicon oxynitride film of 100 nm thick are stacked as the base film. Here, high-density plasma treatment may also be performed in a nitrogen atmosphere to the surface of the base film.

Subsequently, a semiconductor film 103 is formed over the base film 102. As the semiconductor film 103, an amorphous semiconductor film may be formed, but a microcrystal semiconductor film or a crystalline semiconductor film may also be formed. A material for the semiconductor film is not limited, but silicon or silicon germanium (SiGe) is preferably used. In this embodiment mode, a polycrystalline silicon film of 54 nm thick is formed. It is to be noted that a step for removing hydrogen contained in the semiconductor film may be performed after forming the semiconductor film. Specifically, the substrate may be heated at 500° C. for one hour.

When the base film 102 and the semiconductor film 103 are formed so that an interface between the base film 102 and the semiconductor film 103 is not exposed to atmospheric air, contamination of the interface can be prevented, and variation in characteristics of a TFT that will be manufactured can be reduced. In this embodiment mode, the base film 102 and the semiconductor film 103 are formed continuously by a plasma CVD method without being exposed to atmospheric air.

Next, a crystalline semiconductor film 104 is formed by crystallizing the semiconductor film 103 by a laser crystallization method, a thermal crystallization method, a thermal crystallization method using an element such as nickel, which promotes crystallization, or the like. Further, as another crystallization method, by producing thermal plasma by applying a DC bias, the semiconductor film may be acted on by the thermal plasma and crystallized. After the crystallization, doping with an impurity which imparts p-type conductivity such as boron (B) is conducted to an entire surface of the crystalline semiconductor film 104 so that channel doping is conducted to a region to be a channel formation region of a TFT and the threshold voltage of the TFT is controlled.

Figure 1B:
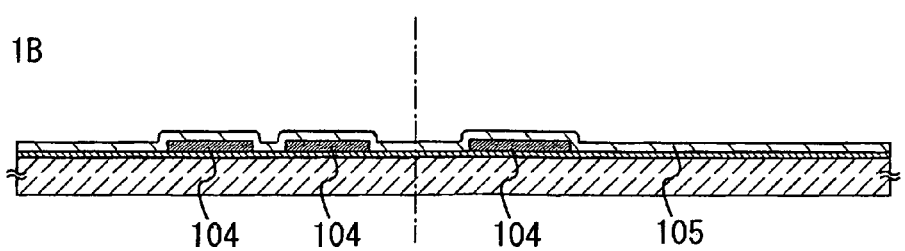

Then, as shown in FIG. 1B, after patterning the crystalline semiconductor film 104, a gate insulating film 105 is formed. As the gate insulating film 105, a single layer structure using any one of a silicon oxide film, a silicon nitride film, a silicon oxynitride film, and a silicon nitride oxide film, or a structure in which these films are appropriately stacked may be employed. In this embodiment mode, a silicon oxide film is stacked to be 110 nm thick.

Figure 1C:
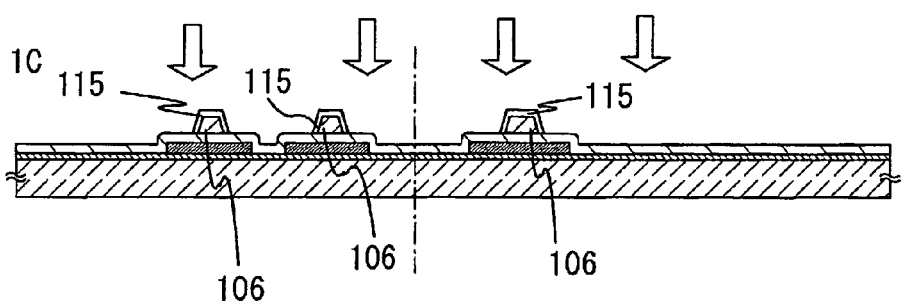

Subsequently, as shown in FIG. 1C, a gate electrode 106 is formed over the gate insulating film 105. As a material for the gate electrode, molybdenum (Mo), tungsten (W), chromium (Cr), tantalum (Ta), aluminum (Al), silicon (Si), or the like can be used, and these materials may be used as a single layer structure or a stacked structure. In this embodiment mode, molybdenum is used as a single layer.

Next, a nitride film is formed over the surface of the gate electrode 106 by high-density plasma produced in a high-density plasma apparatus. For this purpose, high-density plasma treatment may be performed in a nitrogen atmosphere to the surface of the gate electrode 106. In this embodiment mode, as shown in FIG. 1C, a molybdenum nitride film 115 is formed over the surface of the gate electrode 106. In the high-density plasma treatment, plasma is generated by using a high frequency microwave, for example, a microwave of 2.45 GHz. Nitrogen or a gas containing nitrogen is activated by plasma excitation to directly react with the material for the gate electrode, and thus, the molybdenum nitride film 115 is formed over the gate electrode. In generating plasma, a mixed gas of nitrogen ($N_2$) and a rare gas, a mixed gas of ammonia ($NH_3$) and a rare gas, a mixed gas of nitrogen, hydrogen ($H_2$) and a rare gas, or the like can be used. As the rare gas, at least one of helium (He), neon (Ne), argon (Ar), krypton (Kr), and xenon (Xe) may be used. The nitride film formed by using the high-density plasma apparatus includes a rare gas element contained in the mixed gas.

By covering the surface of the gate electrode 106 with the molybdenum nitride film 115, a heat resistant property of the gate electrode 106 is improved, and it is possible to perform heating treatment to the substrate at a higher temperature than that in a case where the surface of the gate electrode is not covered with the molybdenum nitride film. When a processing temperature in film formation is too low, there is a problem that a defect of a film is caused; however, by covering with the molybdenum nitride film, the substrate can be heated at a temperature that is sufficient for processing, and thus, a defect of a film can be reduced and reliability of a TFT can be improved. Furthermore, by covering the gate electrode with the nitride film, the gate electrode can be prevented from being oxidized. In a case of conventional plasma treatment, there is a problem that a film is damaged due to electric charge on the film surface, whereas, in a case of the high-density plasma treatment with a low electron temperature, plasma damage is reduced compared with the conventional plasma treatment because of low kinetic energy of activated species, and a film with fewer defects can be formed; therefore, reliability of a semiconductor device can be further improved.

A high-density plasma treatment apparatus in a case of performing high-density plasma treatment in a nitrogen atmosphere will be described with reference to FIG. 15. First, a treatment chamber is made to be in vacuum and a gas containing nitrogen is introduced from a gas introduction source 65. In this embodiment mode, a mixed gas of ammonia ($NH_3$) and argon (Ar) is introduced. In that case, 20 to 2000 sccm of ammonia and 100 to 10000 sccm of argon may be introduced. When a mixed gas of nitrogen and argon is used, 20 to 2000 sccm of nitrogen and 100 to 10000 sccm of argon may be introduced. Further, when a mixed gas of nitrogen, hydrogen and argon is used, 20 to 2000 sccm of nitrogen, 1 to 500 sccm of hydrogen, and 100 to 10000 sccm of argon may be introduced. Then, the insulating substrate 101 over which components up to the gate electrode 106 are formed is set on a support stand 64 having a heating system and heated to 400° C. A heating temperature may be in a range of 200 to 550° C. (preferably, 250° C. or higher). When a plastic substrate is used as the insulating substrate 101, the plastic substrate having a glass transition point of 200° C. or higher is used and heated to a temperature that is lower than the glass transition point. Spacing between the insulating substrate 101 and an antenna 62 is set to be in a range of 20 to 80 mm (preferably, 20 to 60 mm).

Then, a microwave is supplied from a waveguide 60 to the antenna 62. In this embodiment mode, a microwave having frequency of 2.45 GHz is supplied. Then, the microwave is introduced from the antenna 62 to the treatment chamber through a dielectric plate 63 provided in the treatment chamber, and high-density plasma 66 in which $NH_3$ gas and Ar gas are mixed is produced. NH* radical, which is generated in the high-density plasma 66 in which $NH_3$ gas and Ar gas are mixed, and the gate electrode material react with each other to form a nitride film over the surface of the gate electrode 106. In this embodiment mode, since molybdenum is used for the gate electrode, a molybdenum nitride film is formed over the surface of the gate electrode. $NH_3$ gas and Ar gas that are used in this step are exhausted from an exhaust port 67.

Figure 15:
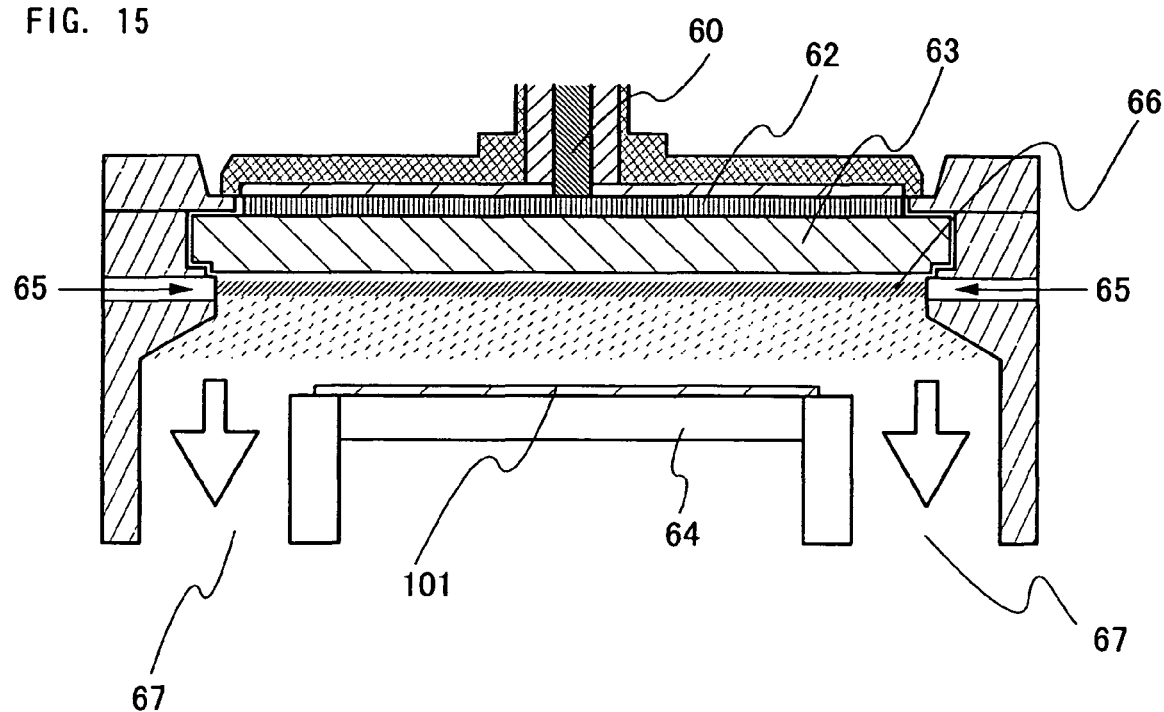
FIG. 15 is a schematic view of a high-density plasma treatment apparatus according to the present invention.

The plasma that is produced by the apparatus shown in FIG. 15 has low electron temperatures (1.5 eV or lower, preferably 0.5 eV or higher and 1.5 eV or lower) and high electron density ($1.0 \times 10^{11}$ cm$^{-3}$ or higher, preferably $1.0 \times 10^{11}$ cm$^{-3}$ or higher and $1.0 \times 10^{13}$ cm$^{-3}$ or lower). Therefore, a dense nitride film with extremely small plasma damage can be formed at a low temperature.

Next, the crystalline semiconductor film 104 is doped with an impurity which imparts p-type conductivity such as boron (B) using the gate electrode 106 as a mask. Through this step, a source region and a drain region of a TFT can be formed in a self-alignment manner. In this embodiment mode, low-concentration impurity regions (LDD regions) are formed between a channel formation region, and a source region and a drain region of a TFT by a known doping method, but a low-concentration impurity region is not always required to be provided. Further, an insulating film (sidewall) may be formed to be in contact with a side surface of the gate electrode provided above or below the semiconductor film, or a silicide layer of nickel, molybdenum, cobalt or the like may be formed over one or both of the source/drain regions and the gate electrode.

In addition, after the doping, heating treatment at 500° C. or higher, intense light irradiation, or laser light irradiation may be performed to activate the impurity element that is added into the impurity region. Accordingly, plasma damage to the gate insulating film 105 and plasma damage to the interface between the gate insulating film 105 and the semiconductor layer can be recovered at the same time as the activation of the impurity element.

After the activation, high-density plasma treatment may be performed to the gate insulating film in a hydrogen atmosphere. After hydrogen is made to be contained in the gate insulating film by the high-density plasma treatment, a step for hydrogenating the patterned crystalline semiconductor film 104 (semiconductor layer) is preferably carried out by heat treatment at temperatures of 300 to 550° C. (preferably 350 to 450° C.) for 1 to 12 hours. In addition, by performing the high-density plasma treatment while heating at temperatures of 300 to 550° C. (preferably 350 to 450° C.), the gate insulating film and the crystalline semiconductor film can be hydrogenated at the same time. By this step, dangling bonds in the semiconductor layer can be terminated by hydrogen contained in the gate insulating film. In this embodiment mode, heating treatment is performed at 410° C. for one hour. In hydrogenation using the high-density plasma apparatus, a mixed gas of hydrogen and a rare gas, a mixed gas of ammonia and a rare gas, or the like may be used. In this embodiment mode, a mixed gas of hydrogen and argon is used.

Figure 1D:
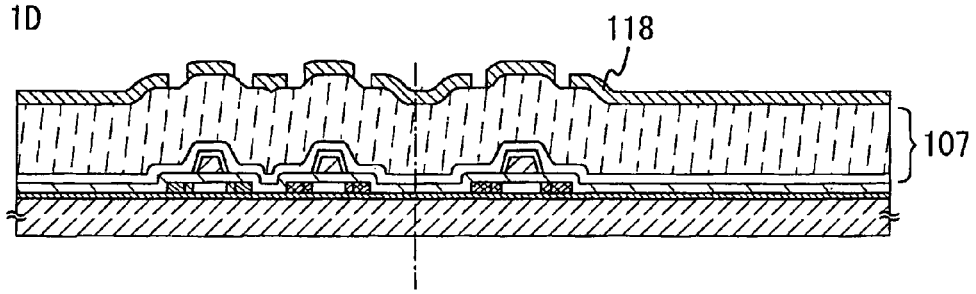

Subsequently, as shown in FIG. 1D, a first interlayer insulating film 107 is formed over the gate insulating film 105 and the gate electrode 106. The first interlayer insulating film 107 can be formed by using silicon oxide, silicone nitride, silicon oxynitride, silicon nitride oxide, aluminum oxide, aluminum nitride, aluminum oxynitride, or other inorganic insulating material; acrylic acid, methacrylic acid, or a derivative thereof; a heat resistant polymer material such as polyimide, aromatic polyamide, or polybenzimidazole; inorganic siloxane containing a Si—O—Si bond among compounds composed of silicon, oxygen, and hydrogen; or an organic siloxane based insulating material in which hydrogen bonded to silicon is substituted by an organic group such as methyl or phenyl. A photosensitive or non-photosensitive material such as acrylic or polyimide may also be used. Further, a stacked film combining those substances may also be used. In this embodiment mode, the first interlayer insulating film 107 has a two-layer structure. As an insulating film of a first layer, a silicon nitride film, a silicon oxide film, or silicon nitride oxide film may be used as a protective film. Here, a silicon nitride film of 100 nm thick is used as the first layer, and a silicon oxynitride film of 900 nm is used as an insulating film of a second layer.

In this embodiment mode, dangling bonds in the semiconductor layer may be terminated by performing high-density plasma treatment in a hydrogen atmosphere after forming the insulating film of the first layer, instead of performing high-density plasma treatment in a hydrogen atmosphere after the activation. In such a case, a mixed gas of hydrogen and a rare gas, or a mixed gas of ammonia and a rare gas may be used. By this step, the insulating film of the first layer is hydrogenated, and dangling bonds in the semiconductor layer can be terminated by hydrogen contained in the insulating film of the first layer.

Figure 1E:
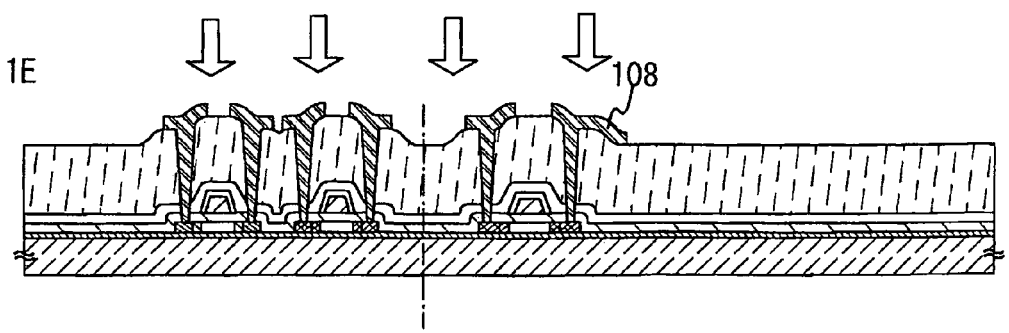

Then, as shown in FIG. 1D, a resist 118 is formed over the first interlayer insulating film 107. Subsequently, contact holes are formed in the first interlayer insulating film 107 to reach a source region and a drain region of a TFT by using the resist 118 as a mask as shown in FIG. 1E. The contact hole preferably has a tapered shape. After forming the contact hole, the resist 118 is removed by an ashing method or a resist stripping method. An ashing method is a resist removing method in a gas phase state, in which a resist pattern is decomposed to carbon dioxide by oxygen plasma. On the other hand, a resist stripping method is a resist removing method in a liquid phase state, in which a substrate is soaked in an organic resist stripping solution which is adjusted to a predetermined temperature (approximately 60 to 90° C.) to dissolve and remove a resist by utilizing a dissolving property of the resist stripping solution. In a case of using a resist stripping method, before removing the resist 118, high-density plasma treatment is preferably performed in a nitrogen atmosphere or an oxygen atmosphere to the resist and the first interlayer insulating film 107. By performing the high-density plasma treatment, a nitride film or an oxide film is formed over a side surface and a bottom surface of the contact hole, that is, over a side surface of the first interlayer insulating film and the surface of the semiconductor film 104, which faces the opening. The nitride film or the oxide film formed on the side surface of the contact hole serves as a protective film, and moisture can be prevented from entering into the first interlayer insulating film 107 when the substrate is soaked in the resist separation solution.

After removing the resist 118, anisotropic etching is performed to remove the nitride film or the oxide film formed over the surface of the crystalline semiconductor film 104. By removing the nitride film or the oxide film formed over the crystalline semiconductor film 104, a contact of the semiconductor film and a wiring that will be formed later can be favorable.

Then, a wiring 108 (electrode) is formed to cover the contact hole. The wiring 108 serves as a source electrode or a drain electrode. The wiring 108 is formed by using metal such as Ag, Au, Cu, Ni, Pt, Pd, Ir, Rh, W, Al, Ta, Mo, Cd, Zn, Fe, Ti, Zr, Ba, or Cr, alloy of the metal, or nitride of the metal. A stacked structure of the above material may also be employed. In this embodiment mode, titanium (Ti) of 100 nm, aluminum (Al) of 700 nm, and titanium of 200 nm are formed and patterned into a desired shape.

After forming the wiring 108, the surface of the wiring may be nitrided by using the high-density plasma apparatus to form a metal nitride film over the surface of the wiring. When nitriding treatment is performed in this embodiment mode, a dense titanium nitride ($TiN_x$) film is formed on a side surface of the titanium film, and a dense aluminum nitride ($AlN_x$) film is formed on a side surface of the aluminum film. The surface of the wiring is covered with a dense metal nitride film by nitriding using the high-density plasma apparatus, and thus, a heat resistant property and reliability of the wiring are improved. Further, by forming a metal nitride film over the surface of the wiring 108, migration can be suppressed and disconnection or the like of the wiring can be suppressed, and thus, reliability of a TFT can be improved.

When the wiring 108 is formed, it is preferable to form a TiN film over the surface of the Ti film (between the first Ti film and the Al film) by performing high-density plasma treatment in a nitrogen atmosphere after forming the first titanium (Ti) film. In that case, the wiring has a four-layer structure in which a titanium (Ti) film, a titanium nitride ($TiN_x$) film, an aluminum (Al) film, and a titanium (Ti) film are sequentially stacked. When treatment at a high temperature is required, there is a concern that Ti and Al react with each other to be alloy, and Al diffuses into the semiconductor film. However, by providing the TiN film here, Al is prevented from passing through Ti and diffusing into the semiconductor film. Further, since the TiN film is formed by the high-density plasma treatment, a step can be simplified. In addition, it is preferable that the titanium film, the titanium nitride film, the aluminum film, and the titanium film be formed continuously without being exposed to atmospheric air.

In addition, high-density plasma treatment may be performed in an oxygen (or a gas containing oxygen) atmosphere instead of performing high-density plasma treatment in a nitrogen atmosphere. In that case, a mixed gas of oxygen ($O_2$) and a rare gas, a mixed gas of oxygen, hydrogen ($H_2$) and a rare gas, or the like may be used. As the rare gas, at least one of helium, neon, argon, krypton, and xenon may be used. When argon is used as the rare gas in the mixed gas of oxygen, hydrogen, and the rare gas, 0.1 to 100 sccm of oxygen, 0.1 to 100 sccm of hydrogen, and 100 to 5000 sccm of argon may be introduced. Further, the mixed gas with the ratio of oxygen:hydrogen:argon of 1:1:100 is preferably introduced. For example, 5 sccm of oxygen, 5 sccm of hydrogen, and 500 sccm of argon may be introduced. Further, when argon is used as the rare gas in the mixed gas of oxygen ($O_2$) and the rare gas, 0.1 to 100 sccm of oxygen and 100 to 5000 sccm of argon may be introduced. The mixed gas with the ratio of oxygen:argon of 1:100 is preferably introduced. When the high-density plasma treatment is performed in an oxygen (or a gas containing oxygen) atmosphere, the ratio of hydrogen to oxygen is preferably 0 to 1.5. When oxidation is performed by using the high-density plasma apparatus, the plasma that is produced has low electron temperatures (1.5 eV or lower, preferably 0.5 eV or higher and 1.5 eV or lower) and high electron density ($1.0 \times 10^{11}$ $cm^{-3}$ or higher, preferably $1.0 \times 10^{11}$ $cm^{-3}$ or higher and $1.0 \times 10^{13}$ $cm^{-3}$ or lower). Therefore, an oxide film with extremely small plasma damage can be formed at a low temperature. The metal oxide film that is formed by oxidation using the high-density plasma apparatus includes a rare gas element contained in the mixed gas.

Figure 2A:
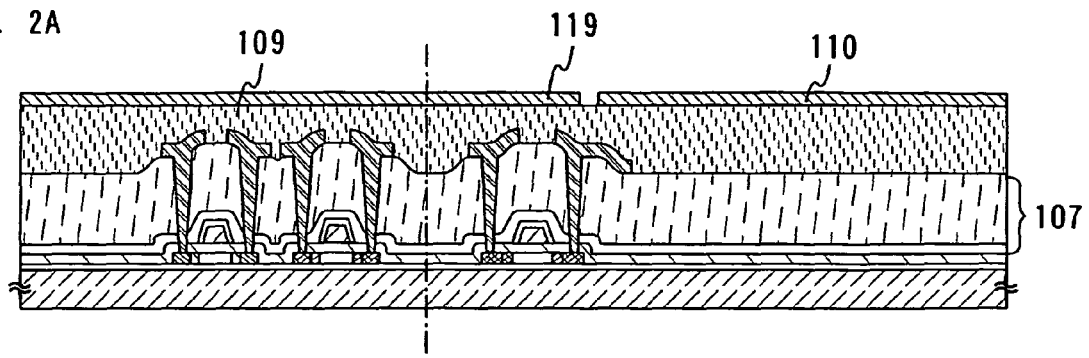
FIGS. 2A to 2D are views each showing a manufacturing step of a semiconductor device according to the present invention.

Subsequently, as shown in FIG. 2A, a second interlayer insulating film 109 is formed over the first interlayer insulating film 107 and the wiring 108. The second interlayer insulating film 109 can be formed by using silicon oxide, silicone nitride, silicon oxynitride, aluminum oxide, aluminum nitride, aluminum oxynitride, or other inorganic insulating material; acrylic acid, methacrylic acid, or a derivative thereof; a heat resistant high molecular material such as polyimide, aromatic polyamide, or polybenzimidazole; inorganic siloxane containing a Si—O—Si bond among compounds composed of silicon, oxygen, and hydrogen; or an organic siloxane based insulating material in which hydrogen bonded to silicon is substituted by an organic group such as methyl or phenyl. A photosensitive or non-photosensitive material such as acrylic or polyimide may also be used. Further, a stacked film formed by combining the above materials may be used as well.

In this embodiment mode, siloxane in which a skeleton structure is formed by a bond of silicon (S) and oxygen (O) is used as a material for the insulating film. As a substituent, an organic group containing at least hydrogen (for example, an alkyl group, aromatic hydrocarbon, or the like) is used. Further, as a substituent, a fluoro group may also be used. Alternatively, as a substituent, both of an organic group containing at least hydrogen and a fluoro group may be used. In this embodiment mode, siloxane is baked to form an insulating film. The film after baking can also be referred to as a silicon oxide (SiOx) film containing an alkyl group. The silicon oxide (SiOx) film containing an alkyl group has a high light-transmitting property and can resist heating treatment at 300° C. or higher. It is also possible to combine a silicon oxide film, a silicon nitride film, a silicon oxynitride film, and a silicon nitride oxide film appropriately.

A method for forming an insulating film by baking siloxane is described here. First, thinner pre-wet treatment is performed to improve wettability after washing with pure water. Then, a composition containing an insulating material in which a low molecular ingredient (a precursor) having a bond of silicon (Si) and oxygen (O) is dissolved in a solvent is coated over the substrate using a coating apparatus. In this embodiment mode, a resin including siloxane by 20 to 40% and using 3-methoxy-3-methyl-1-buthanol as a solvent is coated. After that, the composition is heated with the substrate, volatilization (evaporation) of the solvent and cross-linking reaction of the low molecular ingredient are forwarded, and an insulating film can be obtained. Then, a coated film formed in a circumference of the substrate end portion is removed. A film thickness is controlled by a spin rotation rate, rotation time, and the concentration and viscosity of the composition containing an insulating material, which is a coating material solution. In this embodiment mode, as a coating condition, a rotation rate is to be 1000 rpm for 17 seconds after discharge of 40 ml. Then, heating treatment is performed after coating the resin to form the insulating film. The heating treatment may be performed, for example, under atmospheric pressure or reduced pressure at 350° C. for one hour. In this embodiment mode, the interlayer insulating film 109 is 1.5 µm or more in the thickest portion, and 0.4 µm in the thinnest portion. The thickest portion is a contact portion of the wiring 108 or a peripheral portion of the wiring 108, and the thinnest portion is an upper portion of the wiring 108.

Then, a resist 119 is formed over the second interlayer insulating film 109. Subsequently, a contact hole is formed in the second interlayer insulating film 109 using the resist 119 as a mask. After forming the contact hole, the resist 119 is removed by an ashing method or a resist stripping method. In a case of using a resist stripping method, before removing the resist 119, high-density plasma treatment is preferably performed in a nitrogen atmosphere or an oxygen atmosphere to the resist and the second interlayer insulating film 109. By performing the high-density plasma treatment, a nitride film or an oxide film is formed on a side surface and a bottom surface of the contact hole, that is, on a side surface of the second interlayer insulating film and the surface of the wiring 108, which faces the opening. The nitride film or the oxide film formed on the side surface of the contact hole serves as a protective film, and moisture can be prevented from entering into the second interlayer insulating film 109 when the substrate is soaked in the resist separation solution. After removing the resist 119, anisotropic etching may be performed to remove the nitride film or the oxide film that are formed over the surface of the wiring 108. By removing the nitride film or the oxide film formed over the wiring 108, a contact of the wiring and a first electrode that will be formed later can be favorable.

Next, a first electrode 110 is formed, which is electrically connected to the wiring 108 through the contact hole. The first electrode 110 can be formed by using indium tin oxide containing silicon oxide (hereinafter, ITSO), zinc oxide, tin oxide, indium oxide, indium tin oxide, or the like. In addition, a transparent conductive film such as indium zinc oxide formed by using a target in which indium oxide is mixed with 2 to 20 wt % of zinc oxide (ZnO) may also be used. Further, in addition to the transparent conductive film, a titanium nitride film or a titanium film may also be used. In this case, the titanium nitride film or the titanium film may be formed so as to have a thickness to transmit light (preferably, 5 to 30 nm) after forming the transparent conductive film. In this embodiment mode, an ITSO film of 110 nm thick is formed as the electrode 110.

The surface of the first electrode 110 may be polished by a CMP method or by cleaning with a poly(vinyl alcohol) based porous body so that the surface thereof is planarized. After polishing by a CMP method, oxidation plasma treatment or nitriding plasma treatment may be performed to the surface of the first electrode 110 by using the high-density plasma treatment apparatus. By performing oxidation plasma treatment using the high-density plasma treatment apparatus, the surface of the first electrode 110 can be reformed. By reforming the surface of the first electrode 110, advantageous effect such as improved adhesion of the film and reduction of a film defect can be expected when a film is formed over the first electrode 110 in a subsequent step.

Figure 2B:
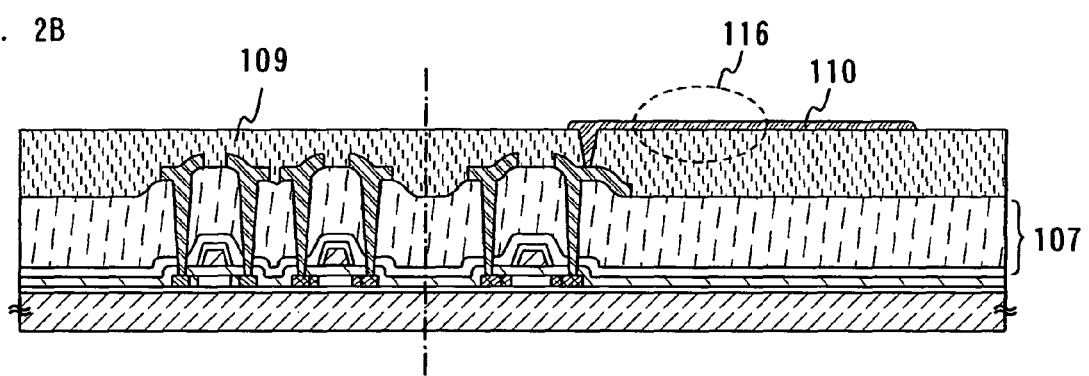
Figure 2C:
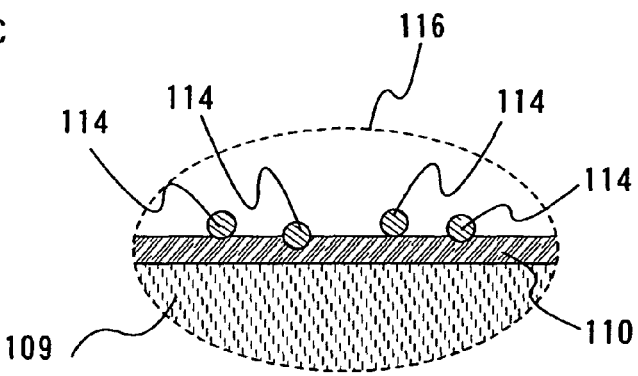

When the first electrode 110 is formed, a dust 114 may be formed over the surface of the first electrode 110 as shown in FIG. 2C. FIG. 2C shows details of a region 116 surrounded by a dotted line in FIG. 2B. The dust 114 is formed in the forming step of the first electrode 110. This dust 114 causes roughness on the surface of the first electrode 110. When a film is formed over the first electrode, planarity of the formed film becomes uneven, and thus, reliability of a semiconductor device can be lowered. Therefore, in order to further enhance reliability of the semiconductor device, the dust 114 formed over the first electrode 110 is required to be removed. The dust is also referred to as a particle.

Figure 2D:
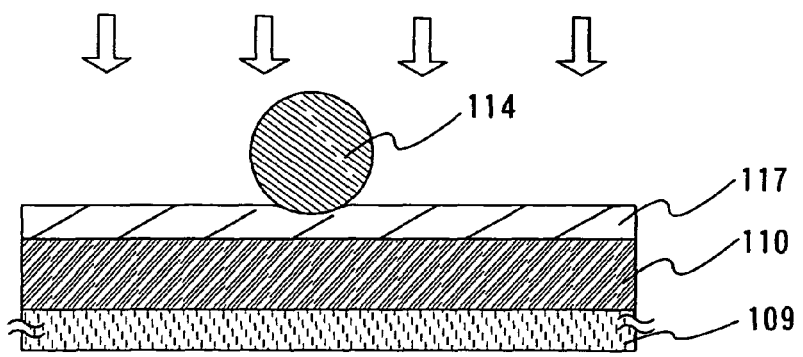

A method for removing the dust in this embodiment mode will be described with reference to FIG. 2D. FIG. 2D is an enlarged view of a part of FIG. 2C. When a nitride film (or an oxide film) 117 is formed over the surface of the first electrode 110 by performing high-density plasma treatment after forming the first electrode 110, the nitride film 117 is formed under the dust 114 as shown in FIG. 2D, and a force is applied to the dust 114 from the nitride film 117. Further, when the dust 114 is a material that can be nitrided, the dust 114 is nitrided and volume thereof is increased. As a result, the dust 114 can be easily removed by only cleaning the surface of the first electrode 110 by brush cleaning or the like. When high-density plasma treatment is performed to the surface of the first electrode 110, a dust of about several nanometers can also be easily removed. As a cleaning method, a bubble jet method (registered trademark), a megasonic method, a method of spraying powder of dry ice, or the like may also be used instead of brush cleaning. This applies not only to this embodiment mode but also other embodiment modes.

In addition, heating treatment may be performed after forming the first electrode 110. Since transmittance of the transparent conductive film can be high by this heating treatment, a highly reliable display device can be manufactured. Further, in this embodiment mode, an atmosphere in the heating treatment is made to contain an inert gas as its main component, in which an oxygen concentration is 5% or lower and a water concentration is 1% or lower. As a result, a crack due to the heating treatment of the interlayer insulating film 109 that is obtained by baking siloxane can be suppressed. The heating treatment is performed at 250° C. for one hour in this embodiment mode.

In this embodiment mode, steps for manufacturing a p-channel TFT are described. However, when the crystalline semiconductor film 104 is doped with an impurity which imparts n-type conductivity by using the gate electrode as a mask, the present invention can also be applied to a manufacturing of an n-channel TFT. In addition, the present invention can be applied to a case where a p-channel TFT and an n-channel TFT are manufactured over the same substrate.

A TFT may have a single gate structure in which one channel formation region is formed, a double gate structure in which two channel formation regions are formed, or a triple gate structure in which three channel formation regions are formed. That is, the present invention can be applied to a TFT having a multi gate structure including a plurality of channel formation regions. Further, a thin film transistor in a peripheral driver circuit region may also have a single gate structure or a multi gate structure such as a double gate structure or a triple gate structure.

The present invention is not limited to be applied to a method for manufacturing the TFT described in this embodiment mode, but also applied to a method for manufacturing a TFT of a top gate type (planar type), a bottom gate type (reversely staggered type), a dual gate type having two gate electrodes arranged above and below a channel region with a gate insulating film interposed therebetween, or other structures.

Through the above steps, a highly reliable TFT can be manufactured.

Embodiment Mode 2

In this embodiment mode, a method for manufacturing a TFT having a nitride film over a surface of a gate insulating film and a gate electrode by nitriding the gate insulating film and the gate electrode using a high-density plasma apparatus will be described.

Figure 3A:
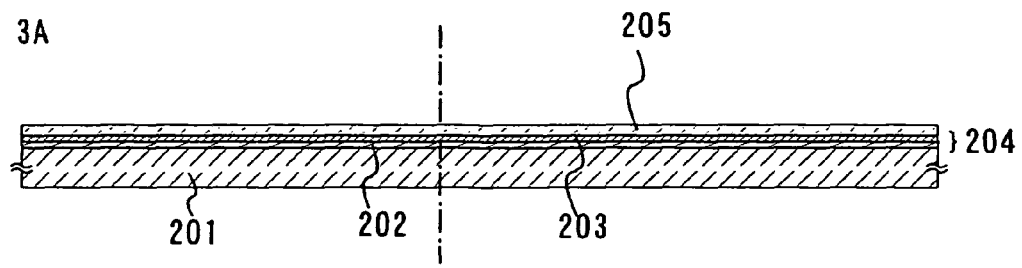
FIGS. 3A to 3E are views each showing a manufacturing step of a semiconductor device according to the present invention.

As shown in FIG. 3A, a base film 204 including a first base film 202 and a second base film 203 is formed over an insulating substrate 201. The insulating substrate 201 can be, for example, a glass substrate such as barium borosilicate glass or alumino borosilicate glass, a quartz substrate, a ceramic substrate, or the like. In addition, a substrate formed of a synthetic resin having flexibility such as a plastic can also be used as long as it can resist a processing temperature in a manufacturing step, although such a substrate generally tends to have a low allowable temperature limit compared with the above substrates. The surface of the insulating substrate 201 may be polished by a CMP method or the like to be planarized. In this embodiment mode, a glass substrate is used as the insulating substrate 201.

Here, high-density plasma treatment is performed to the glass substrate in a nitrogen atmosphere, and a silicon nitride film is formed over the glass substrate. The silicon nitride film that is formed here is used as the first base film 202. Then, the second base film 203 is formed over the first base film 202 by a CVD method, a sputtering method, or the like. As the second base film 203, a single layer structure using any one of a silicon oxide film, a silicon nitride film, a silicon oxynitride film, and a silicon nitride oxide film, or a structure in which these films are appropriately stacked may be employed. In this embodiment mode, a silicon oxide film of 100 nm thick is formed as the second base film 203. Here, high-density plasma treatment may be performed in a nitrogen atmosphere to the surface of the second base film 203.

Subsequently, a semiconductor film 205 is formed over the base film 204. As the semiconductor film 205, an amorphous semiconductor film may be formed, but a microcrystal semiconductor film or a crystalline semiconductor film may also be formed. A material for the semiconductor film is not limited, but silicon or silicon germanium (SiGe) is preferably used. In this embodiment mode, a polycrystalline silicon film of 54 nm thick is formed. It is to be noted that a step for removing hydrogen contained in the semiconductor film may be performed after forming the semiconductor film. Specifically, the substrate may be heated at 500° C. for one hour.

When the base film 204 and the semiconductor film 205 are formed so that an interface between the base film 204 and the semiconductor film 205 is not exposed to atmospheric air, contamination of the interface can be prevented, and variation in characteristics of a TFT that will be manufactured can be reduced. In this embodiment mode, the base film 204 and the semiconductor film 205 are formed continuously by a plasma CVD method without being exposed to atmospheric air.

Next, a crystalline semiconductor film 206 is formed by crystallizing the semiconductor film 205 by a known method such as a laser crystallization method, a thermal crystallization method, or a thermal crystallization method using an element such as nickel, which promotes crystallization. After the crystallization, doping with an impurity which imparts p-type conductivity such as boron (B) is conducted to an entire surface of the crystalline semiconductor film 206 so that channel doping is conducted to a region to be a channel formation region of a TFT and the threshold voltage of the TFT is controlled.

Figure 3B:
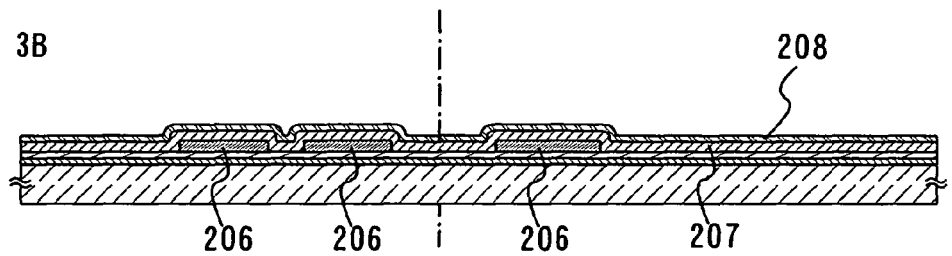

Then, as shown in FIG. 3B, after patterning the crystalline semiconductor film 206, a gate insulating film 207 is formed. As the gate insulating film 207, a single layer structure using any one of a silicon oxide film, a silicon nitride film, a silicon oxynitride film, and a silicon nitride oxide film, or a structure in which these films are appropriately stacked may be employed. In this embodiment mode, a silicon oxide film of 110 nm thick is formed as the gate insulating film 207. Here, high-density plasma treatment is preferably performed in a nitrogen atmosphere to the gate insulating film 207. In this embodiment mode, since a silicon oxide film is used as the gate insulating film, a dense silicon nitride film (or a silicon oxynitride film) 208 with less damage due to plasma is formed over the gate insulating film 207 by performing the high-density plasma treatment. By providing the silicon nitride film 208, moisture can be prevented from entering into the silicon oxide film, and a gate electrode that will be formed later can be prevented from being oxidized.

Figure 3C:
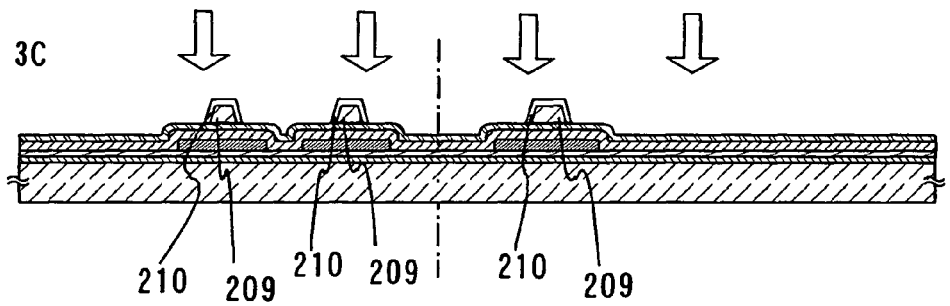

Subsequently, as shown in FIG. 3C, a gate electrode 209 is formed over the gate insulating film 207 by a sputtering method or the like. As a material for the gate electrode, molybdenum (Mo), tungsten (W), chromium (Cr), tantalum (Ta), aluminum (Al), silicon (Si), or the like can be used. These materials may be used as a single layer structure or a stacked structure as the gate electrode. In this embodiment mode, molybdenum is used as a single layer.

Then, similarly to Embodiment Mode 1, a nitride film 210 is formed over the surface of the gate electrode 209 by nitriding using the high-density plasma apparatus. In this embodiment mode, since molybdenum is used as the gate electrode, a molybdenum nitride film is formed over the surface of the gate electrode 209.

Next, the crystalline semiconductor film 206 is doped with an impurity which imparts p-type conductivity such as boron (B) using the gate electrode 209 as a mask. Through this step, a source region and a drain region of a TFT can be formed in a self-alignment manner. In this embodiment mode, low-concentration impurity regions (LDD regions) are formed between a channel formation region, and a source region and a drain region of a TFT by a known doping method, but a low-concentration impurity region is not always required to be provided.

After a natural oxide film over the surface of the impurity region that is formed by the doping is removed, a silicide region may be formed by using a metal film. As the metal film, a nickel film, a titanium film, a cobalt film, a platinum film, a film formed of alloy including at least two kinds of the elements, or the like can be used. More specifically, for example, a nickel film is used as the metal film, and the nickel film is formed by a sputtering method at a room temperature by deposition power of 500 W to 1 kW, and then, a silicide region is formed by heating treatment. As the heating treatment, RTA, furnace annealing, or the like can be used. At this time, a silicide region can be formed only over an upper surface of the impurity region, or a silicide region can be formed over an entire surface thereof by controlling a thickness of the metal film, a heating temperature, and a heating time. Finally, nickel that has not reacted is removed. For example, an etching solution with the ratio of $HCl:HNO_3:H_2O=3:2:1$ is used to remove nickel that has not reacted.

After the doping, heating treatment at 500° C. or higher, intense light irradiation, or laser light irradiation may be performed to activate the impurity element that is added into the impurity region. Accordingly, plasma damage to the gate insulating film and plasma damage to the interface between the gate insulating film and the semiconductor layer can be recovered at the same time as the activation of the impurity element.

Further, similarly to Embodiment Mode 1, high-density plasma treatment may be performed to the gate insulating film in a hydrogen atmosphere after the activation. By this step, dangling bonds in the semiconductor layer can be terminated by hydrogen contained in the gate insulating film. In this embodiment mode, heating treatment is performed at 410° C. for one hour to terminate dangling bonds in the semiconductor layer. In hydrogenation using the high-density plasma apparatus, a mixed gas of hydrogen and argon is used in this embodiment mode.

Figure 3D:
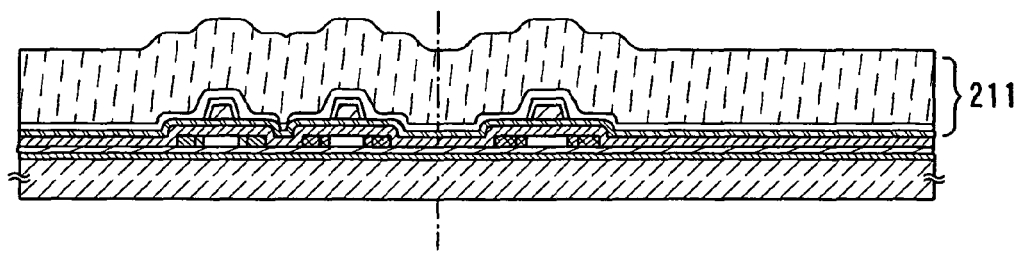

Subsequently, as shown in FIG. 3D, a first interlayer insulating film 211 is formed over the gate insulating film 207 and the gate electrode 209. The first interlayer insulating film 211 can be formed by using silicon oxide, silicone nitride, silicon oxynitride, silicon nitride oxide, aluminum oxide, aluminum nitride, aluminum oxynitride, or other inorganic insulating material; acrylic acid, methacrylic acid, or a derivative thereof; a heat resistant high molecular material such as polyimide, aromatic polyamide, or polybenzimidazole; inorganic siloxane containing a Si—O—Si bond among compounds composed of silicon, oxygen, and hydrogen; or an organic siloxane based insulating material in which hydrogen bonded to silicon is substituted by an organic group such as methyl or phenyl. A photosensitive or non-photosensitive material such as acrylic or polyimide may also be used. A single layer structure of these materials may be employed, or a stacked structure combining these materials may also be employed. In this embodiment mode, a silicon nitride oxide film of 100 nm thick and a silicon oxynitride film of 900 nm thick are sequentially stacked as the first interlayer insulating film 211. In this embodiment mode, high-density plasma treatment is performed to the gate insulating film 207 and the gate electrode 209, and a dense nitride film is formed over each surface, and thus, an insulating film as a protective film is not particularly required. Here, high-density plasma treatment is preferably performed to the first interlayer insulating film 211 in a nitrogen atmosphere or an oxygen atmosphere. By the high-density plasma treatment, a dense nitride film or oxide film with less damage due to plasma is formed over the surface of the first interlayer insulating film 211. The dense nitride film or oxide film formed by the high-density plasma treatment serves as a protective film, and thus, moisture can be prevented from entering into the first interlayer insulating film.

Figure 3E:
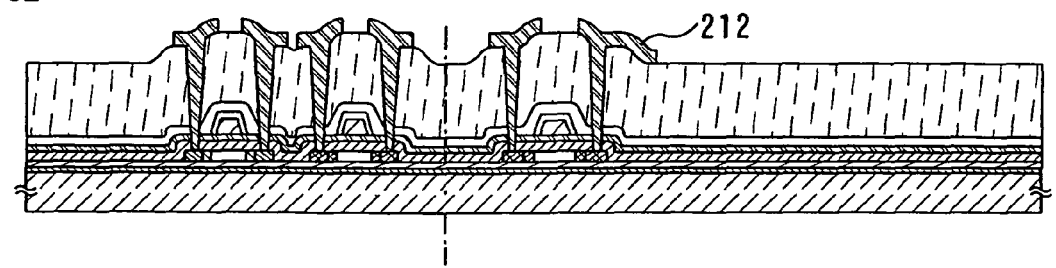

Subsequent steps will be carried out similarly to Embodiment Mode 1, and a highly reliable TFT including a source wiring and a drain wiring 212 as shown in FIG. 3E can be manufactured.

Embodiment Mode 3

In this embodiment mode, a method for manufacturing a display device (an EL display device) including an electroluminescence element (hereinafter referred to as an EL element) using the TFT manufactured in Embodiment Mode 1 will be described. Obviously, the TFT manufactured in Embodiment Mode 2 can also be used.

In this embodiment mode, a first electrode 110 is formed by using a film having a light-transmitting property to have a structure in which light from an electroluminescence element is extracted from the first electrode 110 side. In this embodiment mode, similarly to Embodiment Mode 1, indium tin oxide containing silicon oxide (ITSO) is used as the first electrode 110.

Figure 4:
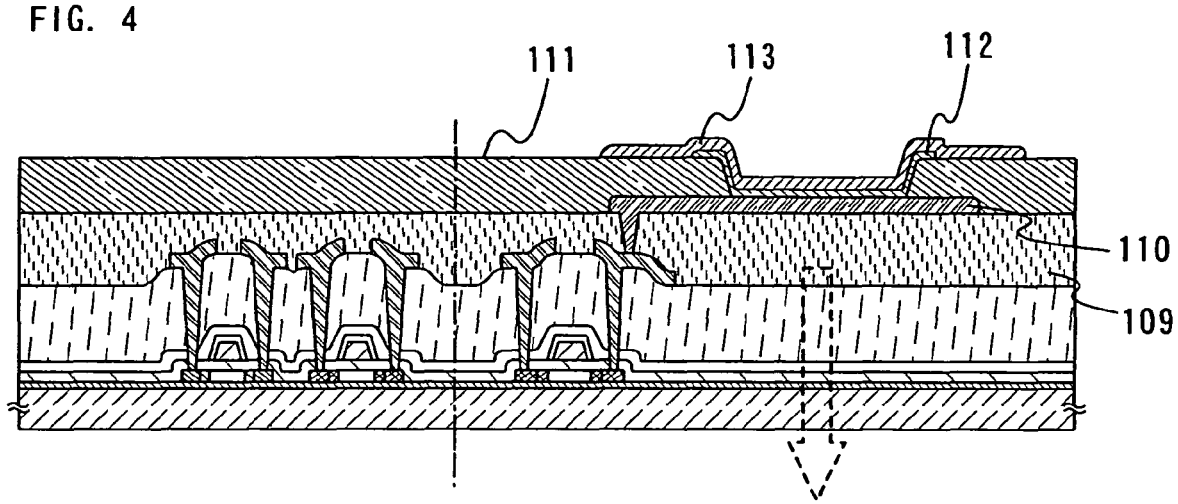
FIG. 4 is a view showing a manufacturing step of a semiconductor device according to the present invention.

First, as shown in FIG. 4, an insulating film 111 (referred to as a bank, a partition wall, a barrier, an embankment, or the like) is formed to cover an end portion of the first electrode 110 and the TFT.

The insulating film 111 can be formed by using silicon oxide, silicone nitride, silicon oxynitride, aluminum oxide, aluminum nitride, aluminum oxynitride, or other inorganic insulating material; acrylic acid, methacrylic acid, or a derivative thereof; a heat resistant high molecular material such as polyimide, aromatic polyamide, or polybenzimidazole; inorganic siloxane containing a Si—O—Si bond among compounds composed of silicon, oxygen, and hydrogen; or an organic siloxane based insulating material in which hydrogen bonded to silicon is substituted by an organic group such as methyl or phenyl. A photosensitive or non-photosensitive material such as acrylic or polyimide may also be used. In this embodiment mode, the insulating film 111 is formed by using photosensitive polyimide so as to have a thickness of 1.5 μm in a flat region.

In addition, the insulating film 111 preferably has a shape in which radius of curvature changes continuously so that coverage of an electroluminescent layer 112 (a layer containing an organic compound) and a second electrode 113 formed over the insulating film 111 can be improved.

In order to further improve reliability, nitriding treatment or oxidation treatment is preferably performed by using a high-density plasma apparatus to the first electrode 110 and the insulating film 111 before forming the electroluminescent layer 112. By nitriding or oxidizing the first electrode 110 by using the high-density plasma apparatus, plasma damage in reforming the surface of the electrode can be reduced, and a surface with fewer defects can be obtained. Thus, a light-emitting element in this embodiment mode can provide display with high definition and less unevenness. Further, when the insulating film 111 is nitrided, the surface of the insulating film 111 is reformed, and moisture can be prevented from being absorbed into the insulating film. When the insulating film 111 is oxidized, the film becomes stronger, and release of an organic gas can be suppressed. In this embodiment mode, treatment with less plasma damage can be performed by using a high-density plasma apparatus. It is appropriately determined which of oxidizing treatment and nitriding treatment is performed to the surface of the insulating film 111 by considering a material of the insulating film and effect.

Further, by performing high-density plasma treatment to the first electrode 110 and the insulating film 111, a dust formed over the first electrode as shown in FIG. 2C can be easily removed. When the electroluminescent layer 112 is formed without removing the dust 114, adhesion of the electroluminescent layer 112 gets worse and a film thickness becomes uneven, because the surface of the first electrode 110 is uneven. As a result, short-circuit or a leak is caused, and reliability of an EL display device can be lowered. In this embodiment mode, a nitride film or an oxide film is formed over the surface of the first electrode 110 and the insulating film 111 by performing high-density plasma treatment after forming the first electrode 110 and the insulating film 111;

and therefore, pressure is applied from the surface of the first electrode 110 to the dust 114, and thus, the dust can be easily removed by cleaning the surface of the first electrode 110 by brush cleaning or the like. As a cleaning method, a bubble jet method (registered trademark), a megasonic method, a method of spraying powder of dry ice, or the like may also be used instead of brush cleaning. In this embodiment mode, high-density plasma treatment and surface cleaning are performed after forming the first electrode 110 and the insulating film 111; however, these treatments may also be performed before forming the insulating film 111.

The electroluminescent layer 112 is formed over the first electrode 110. Although only one pixel is shown in FIG. 4, electroluminescent layers for each color of R (red), G (green) or B (blue) are formed in this embodiment mode. In this embodiment mode, as the electroluminescent layer 112, materials exhibiting light emission of red (R), green (G), and blue (B) are each selectively formed by an evaporation method using an evaporation mask. The materials exhibiting light emission of red (R), green (G), and blue (B) can be formed by a method of selectively forming with an evaporation method using an evaporation mask, or a droplet discharge method. In a case of a droplet discharge method, there is an advantage that materials of R, G, and B can be individually formed without using a mask. In this embodiment mode, materials exhibiting light emission of R (red), G (green) and B (blue) are each formed by an evaporation method.

Before evaporation of EL, it is preferable to remove moisture and the like by heating treatment in an atmosphere where an inert gas is a main component, an oxygen concentration is 5% or lower, and a water concentration is 1% or lower. In this embodiment mode, heating treatment is performed at 300° C. for one hour.

Next, a second electrode 113 is formed by using a conductive film over the electroluminescent layer 112. The second electrode 113 may be formed by using a material having a low work function (In, Al, Ag, Li, Ca, or alloy containing thereof such as MgAg, MgIn, AlLi, CaF$_2$, or CaN). Accordingly, a light-emitting element including the first electrode 110, the electroluminescent layer 112, and the second electrode 113 is formed.

In a display device shown in FIG. 4, light from the light-emitting element is transmitted through the films that are formed between the insulating substrate 101 and the first electrode 110 and is emitted from the first electrode 110 side in a direction indicated by an arrow.

It is effective to form a passivation film so as to cover the second electrode 113. The passivation film can be formed by using an insulating film including silicon nitride, silicon oxide, silicon oxynitride (SiON), silicon nitride oxide (SiNO), aluminum nitride (AlN), aluminum oxynitride (AlON), aluminum nitride oxide (AlNO) in which the nitrogen content is higher than the oxygen content, aluminum oxide, diamond like carbon (DLC) or a nitrogen-containing carbon film. The passivation film can have a single layer structure of the insulating film or a stacked layer structure combining the insulating films. Further, siloxane in which a skeleton structure is formed by a bond of silicon (S) and oxygen (O) may also be used. In siloxane, an organic group containing at least hydrogen (for example, an alkyl group or aromatic hydrocarbon) is used as a substituent. In addition, as a substituent, a fluoro group, or an organic group containing at least hydrogen and a fluoro group may also be used.

In this case, a film with favorable coverage is preferably used as the passivation film. A carbon film, in particular, a DLC film is effectively used. Since the DLC film can be formed within a temperature range of a room temperature to 100° C. or lower, the DLC film can be easily formed over the electroluminescent layer 112 having a low heat resistant property. The DLC film has a high blocking property with respect to oxygen, and thus, the electroluminescent layer 112 can be prevented from being oxidized. Accordingly, a problem that the electroluminescent layer 112 is oxidized during a subsequent sealing step can be prevented.

Subsequently, the insulating substrate 101 including the light-emitting element and a sealing substrate are attached to each other by a sealing material, and the light-emitting element is sealed. Since moisture is prevented from entering from a side-direction by the sealing material, deterioration of the light emitting element can be prevented and reliability of the display device can be improved. A region surrounded by the sealing material may be filled with a filler and may be filled with nitrogen or the like by sealing in a nitrogen atmosphere. Further, the filler can be dropped in a liquid state and can also be filled in the display device. This embodiment mode employs a bottom emission type, and it is not necessary to use a filler having a light-transmitting property. However, in a case of a structure in which light is extracted through the filler, the filler is required to be formed by using a material having a light-transmitting property. As an example of the filler, a visible light curable, ultraviolet ray curable, or thermal curable epoxy resin can be given. The display device including the light-emitting element can be completed though the above steps.

A drying agent is preferably provided in the EL display panel to prevent deterioration of the element due to moisture. In this embodiment mode, the drying agent is provided in a concave portion that is formed over the sealing substrate to surround a pixel region so that a thin shape is achieved. Further, by providing the drying agent also in a region corresponding to a gate wiring layer, a moisture absorbing area can be larger and moisture absorbing effect is enhanced. In addition, since the drying agent is formed over the gate wiring layer which does not emit light itself, light extraction efficiency is not lowered.

This embodiment mode describes a case where the light-emitting element is sealed by a glass substrate. The sealing treatment is treatment for protecting a light-emitting element from moisture, and any of a method for mechanically sealing the light-emitting element by a cover material, a method for sealing the light-emitting element by a thermal curable resin or an ultraviolet ray curable resin, and a method for sealing the light-emitting element by a thin film having a high barrier property such as metal oxide or metal nitride may be used. As the cover material, glass, ceramics, a plastic, or metal can be used; however, a material which transmits light is required to be used in a case where light is emitted to a cover material side. The cover material and the substrate including the light-emitting element are attached to each other using a sealing material such as a thermal curable resin or an ultraviolet ray curable resin, and a sealed space is formed by curing the resin using heat treatment or ultraviolet ray irradiation treatment. It is also effective to provide a moisture absorbing material typified by barium oxide in this sealed space. This moisture absorbing material may be provided over the sealing material, or over the partition wall or in the periphery of the light-emitting element so as not to shield light from the light-emitting element. Further, the space between the cover material and the substrate including the light-emitting element can also be filled with a thermal curable resin or an ultraviolet ray curable resin. In this case, it is effective to add a moisture absorbing material typified by barium oxide in the thermal curable resin or the ultraviolet ray curable resin.

By implementing the present invention, a highly reliable display device can be manufactured, which includes a gate electrode that is nitrided by using a high-density plasma apparatus, a wiring that is nitrided or oxidized by using the high-density plasma apparatus, and a pixel electrode, a surface of which is reformed by using the high-density plasma apparatus. Therefore, a high definition and high image quality display device can be manufactured at a low cost with high yield.

Embodiment Mode 4

One embodiment mode of the present invention will be described with reference to FIGS. 5A and 5B, and 6A and 6B. This embodiment mode shows an example of forming a semiconductor device without forming the second interlayer insulating film 109 in the display device manufactured in Embodiment Mode 1. Therefore, an explanation of the same portions or a portion having the same functions is not repeated. In addition, the TFT manufactured in Embodiment Mode 2 can also be used.

In this embodiment mode, steps up to the step of forming a gate electrode 106 are the same as that in Embodiment Mode 1, and thus, subsequent steps will be described.

Figure 5A:
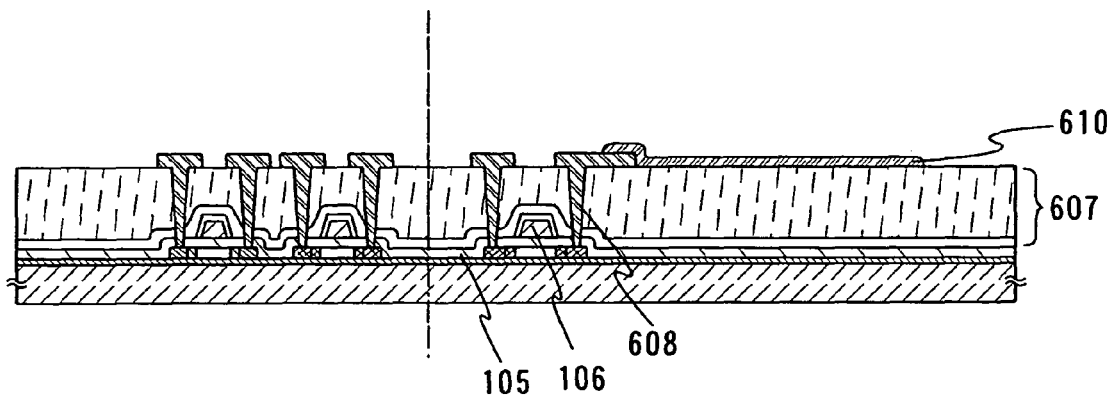
FIGS. 5A and 5B are views each showing a manufacturing step of a semiconductor device according to the present invention.

As shown in FIG. 5A, a first interlayer insulating film 607 is formed over a gate insulating film 105 and the gate electrode 106. In this embodiment mode, as the first interlayer insulating film 607, a silicon nitride oxide film and an insulating film that is obtained by baking siloxane are used. In addition, a film formed of silicon oxide, silicone nitride, silicon oxynitride, aluminum oxide, aluminum nitride, aluminum oxynitride or other inorganic insulating material may also be used instead of the silicon nitride oxide film or the insulating film that is obtained by baking siloxane.

The insulating film that is obtained by baking siloxane is formed by performing heating treatment after coating the resin as described above. In this heating treatment, pressure in a chamber may be atmospheric pressure or reduced pressure.

Then, contact holes are formed in the first interlayer insulating film 607 so as to reach a source region and a drain region of a TFT. The contact hole may have a tapered shape.

Subsequently, a wiring 608 (electrode) is formed over the first interlayer insulating film to cover the contact hole. The wiring 608 functions as a source electrode or a drain electrode.

After the wiring 608 connected to the source region or the drain region of a semiconductor layer of a TFT is formed, a first electrode 610 is formed to overlap with a part of the wiring 608.

The first electrode 610 functions as a pixel electrode, and the same material as the first electrode 110 in Embodiment Mode 1 may be used. Also in this embodiment mode, ITSO which is a transparent conductive film is formed as the first electrode 610 to extract light through the first electrode 610 similarly to Embodiment Mode 1.

Figure 5B:
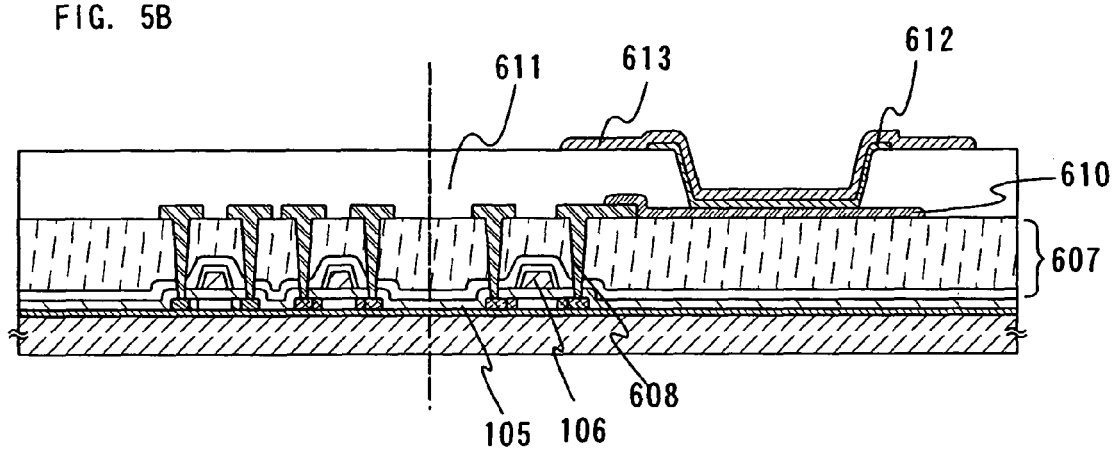

Subsequently, an insulating film 611 is formed to cover an end portion of the first electrode 610 and a TFT as shown in FIG. 5B. The insulating film 611 can be formed by using the same material as the insulating film 111 described in Embodiment Mode 1. In this embodiment mode, acrylic is used as the insulating film 611.

Nitriding treatment or oxidation treatment may be performed to the first electrode 610 and the insulating film 611 by using a high-density plasma apparatus similarly to Embodiment Mode 2. In addition, nitriding treatment or oxidation treatment may be performed by using the high-density plasma apparatus before forming the insulating film 611.

Then, an electroluminescent layer 612 is formed over the first electrode 610, and a second electrode 613 is stacked thereover, and thus, a light emitting element is formed. A passivation film is formed to cover the second electrode 613. Finally, a TFT substrate and a sealing substrate are attached to each other by a sealing material. In addition, a region surrounded by the sealing material may be filled with a filler.

Figure 6A:
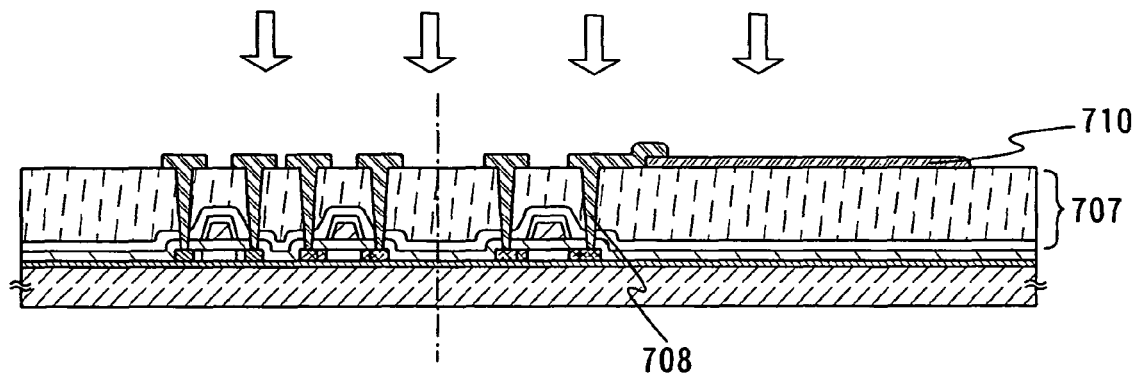
FIGS. 6A and 6B are views each showing a manufacturing step of a semiconductor device according to the present invention.
Figure 6B:
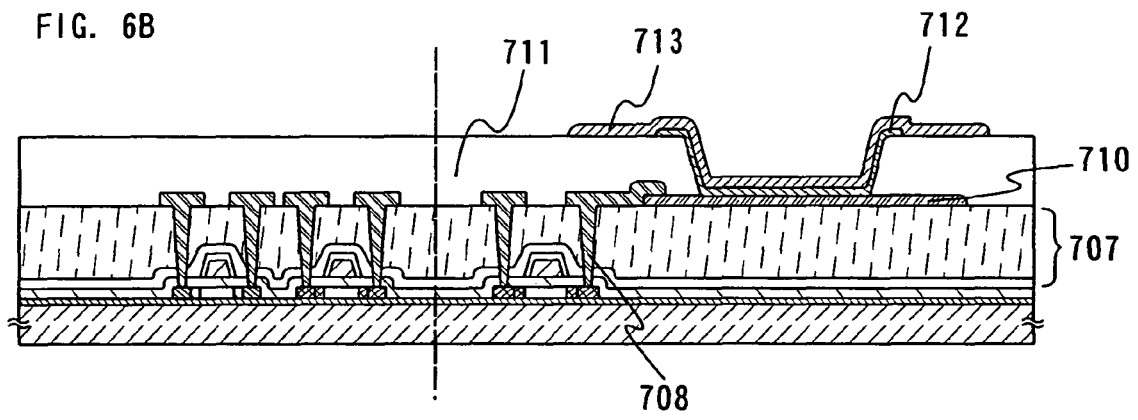

In a display device shown in FIGS. 6A and 6B, a wiring 708 and a first electrode 710 are connected to each other such that the wiring 708 is formed over a part of the first electrode 710. In order to obtain such a structure, after the first electrode 710 is formed over a first interlayer insulating film 707 as shown in FIG. 6A, a contact hole is formed in the first interlayer insulating film 707, and the wiring 708 may be formed to overlap with a part of the first electrode 710. By this structure, the first electrode 710 can be formed over the insulating film that is obtained by baking a resin containing siloxane, and thus, coverage is favorable. Moreover, polishing treatment such as CMP can be sufficiently performed to the first electrode 710, and it can be formed with favorable planarity.

Next, an insulating film 711 is formed to cover an end portion of the first electrode 710 and a TFT as shown in FIG. 6B. The insulating film 711 can be formed by using the same material as the insulating film 111 as described in Embodiment Mode 1. In this embodiment mode, siloxane is used as the insulating film 711.

Nitriding treatment or oxidation treatment may be performed to the first electrode 710 and the insulating film 711 by using a high-density plasma apparatus similarly to Embodiment Mode 2. In addition, nitriding treatment or oxidation treatment may be performed by using the high-density plasma apparatus before forming the insulating film 711.

Then, an electroluminescent layer 712 is formed over the first electrode 710, and a second electrode 713 is stacked thereover, and thus, a light emitting element is formed. A passivation film is formed to cover the second electrode 713. Finally, a TFT substrate and a sealing substrate are attached to each other by a sealing material. In addition, a region surrounded by the sealing material may be filled with a filler.

By implementing the present invention, a highly reliable display device can be manufactured. Therefore, a high definition and high image quality display device can be manufactured at a low cost with high yield.

Embodiment Mode 5

A display device including a light emitting-element can be formed by applying the present invention. As an emission mode of light from the light-emitting element, there are three modes of a bottom emission type, a top emission type, and a dual emission type. In Embodiment Mode 3, an example of a bottom emission type that is a one-side emission type is described. In this embodiment mode, examples of a dual emission type and a top emission type that is a one-side emission type will be described with reference to FIGS. 7 and 8.

Figure 7:
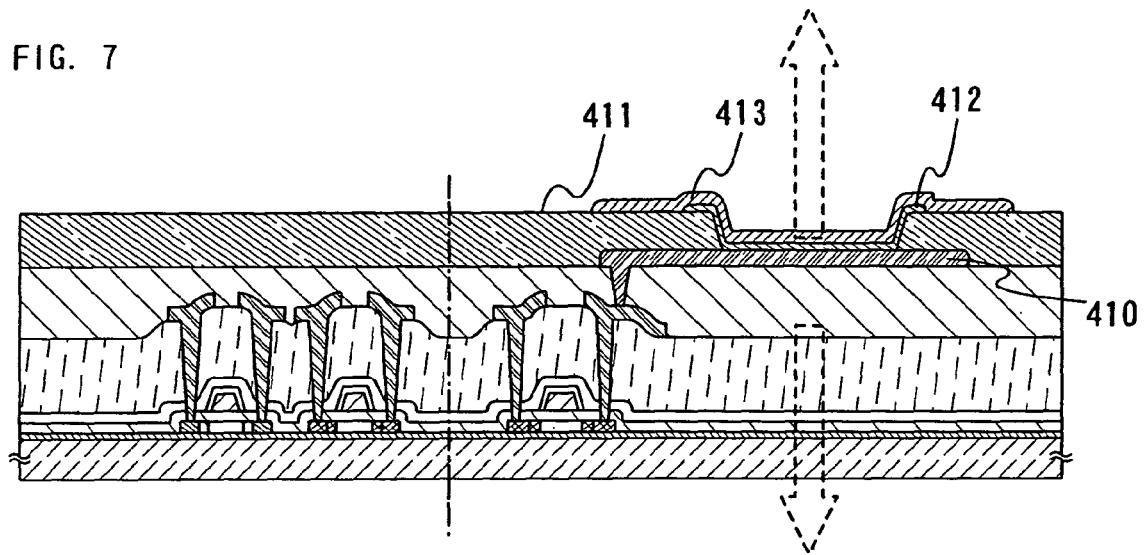
FIG. 7 is a view showing a manufacturing step of a semiconductor device according to the present invention.

FIG. 7 shows a dual emission display device, in which light is emitted from both of a side of a substrate provided with a light-emitting element and a side of a sealing substrate in directions indicated by arrows. In this embodiment mode, a transparent conductive film can be used as the first electrode 410. When a transparent conductive film is used, a transparent conductive film is formed and etched into a desired shape to form the first electrode 410. Further, a titanium nitride film or a titanium film formed in a thickness so as to transmit light (preferably, about 5 to 30 nm) may be used instead of the transparent conductive film. In addition, it is preferable that, after forming a transparent conductive film, a titanium nitride film or a titanium film is formed in a thickness so as to transmit light (preferably, about 5 to 30 nm). In this embodiment mode, ITSO is used as the first electrode 410.

Then, as shown in FIG. 7, an insulating film 411 (referred to as a bank, a partition wall, a barrier, an embankment or the like) is formed to cover an end portion of the first electrode 410 and a TFT. As the insulating film 411, the same material as the insulating film 111 in Embodiment Mode 2 can be used.

In order to further improve reliability, similarly to Embodiment Mode 2, nitriding treatment or oxidation treatment may be performed by using the high-density plasma apparatus to the first electrode 410 and the insulating film 411 before forming an electroluminescent layer 412. In addition, nitriding treatment or oxidation treatment may be performed before forming the insulating film 411.

Then, the electroluminescent layer 412 is formed over the first electrode 410. Thereafter, a second electrode 413 formed of a conductive film is provided over the electroluminescent layer 412. Since the second electrode 413 functions as a cathode, a material having a low work function (In, Al, Ag, Li, Ca or alloy containing thereof such as MgAg, MgIn, AlLi, $CaF_2$ or CaN) may be used. In a display device of FIG. 7, in order to transmit light, a stacked layer of a metal thin film (MgAg: 10 nm) with a thinned thickness and ITSO (100 nm) that is a transparent conductive material are used as the second electrode 413.

Figure 8:
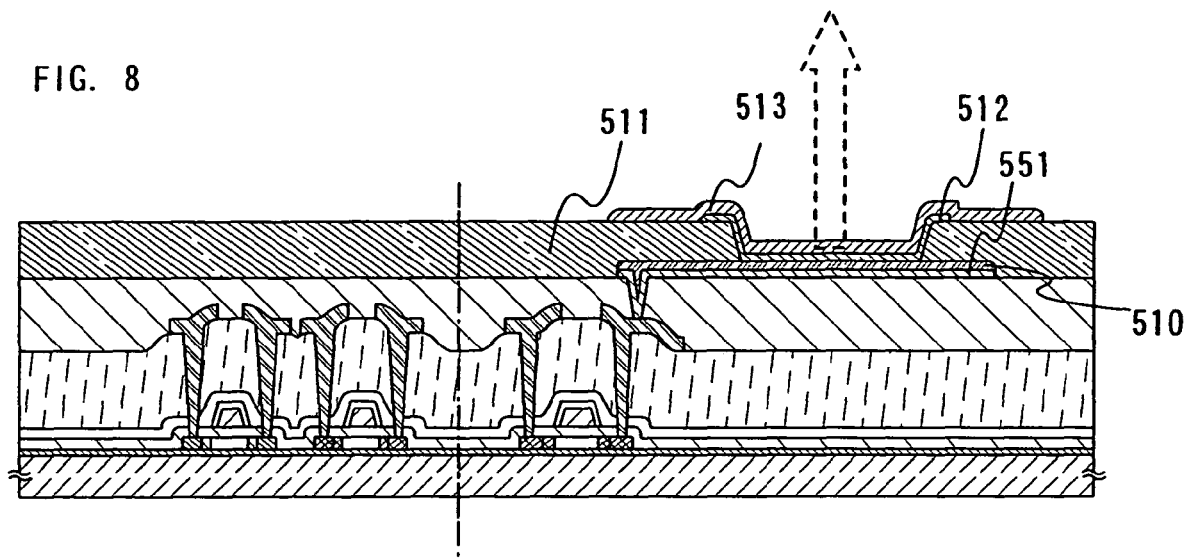
FIG. 8 is a view showing a manufacturing step of a semiconductor device according to the present invention.

FIG. 8 shows a one-side emission display device, specifically, a top emission display device which emits light in a direction indicated by an arrow, and a reflective film is provided below the first electrode 410 in the dual emission display device shown in FIG. 7. In other words, as shown in FIG. 8, a first electrode 510, which is a transparent conductive film and functions as an anode, is provided over a metal film 551 having reflectivity. As the metal film having reflectivity, Ta, W, Ti, Mo, Al, Cu or the like may be used. In particular, a substance having high reflectivity in a visible light region is preferably used, and a TiN film is used in this embodiment mode. In addition, since an insulating film that is obtained by baking siloxane is used as the interlayer insulating film 109 in this embodiment mode, the interlayer insulating film 109 having a favorable insulating property and planarity can be formed, and thus, a light-emitting element in this embodiment mode can provide display with high definition and less unevenness.

Then, as shown in FIG. 8, an insulating film 511 (referred to as a bank, a partition wall, a barrier, an embankment or the like) is formed to cover an end portion of the first electrode 510 and a TFT. As the insulating film 511, the same material as the insulating film 111 in Embodiment Mode 2 can be used. In addition, in order to further improve reliability, similarly to Embodiment Mode 2, nitriding treatment or oxidation treatment may be performed by using a high-density plasma apparatus to the first electrode 510 and the insulating film 511 before forming an electroluminescent layer 512. Further, nitriding treatment or oxidation treatment may be performed before forming the insulating film 511.

Then, the electroluminescent layer 512 is formed over the first electrode 510. Thereafter, a second electrode 513 formed of a conductive film is provided over the electroluminescent layer 512. Since the second electrode 513 functions as a cathode, a material having a low work function (In, Al, Ag, Li, Ca or alloy containing thereof such as MgAg, MgIn, AlLi, $CaF_2$, or CaN) may be used. In this embodiment mode, in order to transmit light, a metal thin film (MgAg: 10 nm) with a thinned thickness and ITSO (100 nm) that is a transparent conductive material may be stacked as the second electrode 513.

Embodiment Mode 6

In this embodiment mode, a method for manufacturing a transmission type liquid crystal display device by using the TFT manufactured in Embodiment Mode 1 will be described. Obviously, the TFT manufactured in Embodiment Mode 2 can also be used.

Figure 9:
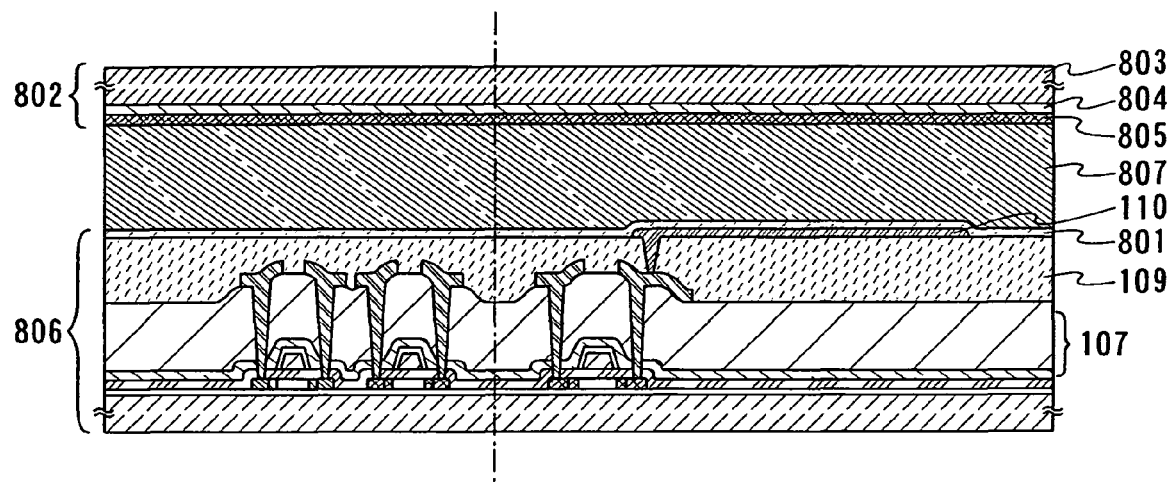
FIG. 9 is a view showing a manufacturing step of a semiconductor device according to the present invention.

Similarly to Embodiment Mode 1, the components up to the first electrode 110 are formed as shown in FIG. 2B. In this embodiment mode, indium tin oxide containing silicon oxide (ITSO) is used as a material for the first electrode 110 similarly to Embodiment Mode 1. Then, as shown in FIG. 9, an orientation film 801 is formed over a second interlayer insulating film 109 and the first electrode 110. In this embodiment mode, polyimide is used as the orientation film 801. Subsequently, an opposing substrate 802 is prepared. The opposing substrate 802 includes a glass substrate 803, an opposing electrode 804 formed of a transparent conductive film, and an orientation film 805.

Then, a TFT substrate 806 obtained through the steps as described above and the opposing substrate 802 are attached to each other by a sealing material. Here, a spacer may be provided between the orientation film 801 and the orientation film 805 to keep a constant space between the both substrates. Thereafter, a liquid crystal 807 is injected between the both substrates, and a transmission type liquid crystal display device as shown in FIG. 9 is completed by sealing with a sealant.

A transmission type liquid crystal display device is described in this embodiment mode, but a liquid crystal display device of the present invention is not limited to this type. The present invention can also be applied to a reflection type liquid crystal display device by using an electrode having reflectivity as the first electrode 110, or by providing a reflective film over an upper surface or a bottom surface of the first electrode 110. In addition, the present invention may be applied to a semi-transmission type liquid crystal display device.

By implementing the present invention, a highly reliable display device can be manufactured, which includes a gate electrode that is nitrided by using a high-density plasma apparatus, a wiring that is nitrided or oxidized by using the high-density plasma apparatus, and a pixel electrode, a surface which is reformed by using the high-density plasma apparatus.

Embodiment Mode 7

Here, a process of manufacturing a thin film integrated circuit or a non-contact thin film integrated circuit device (also referred to as a wireless IC tag or an RFID (Radio Frequency Identification)) will be described as an example of a semiconductor device manufactured according to the present invention, with reference to FIGS. 10A to 10E, 11A to 11C, 12A and 12B, 13A to 13C, and 14A and 14B.

Although an example of using an electrically isolated TFT as a semiconductor element used for an integrated circuit of a wireless IC tag is described below, the semiconductor element used for the integrated circuit of the wireless IC tag is not limited to a TFT and any kinds of elements can be used. For example, in addition to a TFT, a storage element, a diode, a photoelectric conversion element, a resistor element, a coil, a capacitor element, an inductor, or the like is typically given.

First, as shown in FIG. 10A, a separation layer 1701 is formed over a glass substrate (a first substrate) 1700 by a sputtering method. The separation layer 1701 can be formed by a sputtering method, a low-pressure CVD method, a plasma CVD method, or the like. In this embodiment mode, amorphous silicon is formed to be approximately 50 nm thick by a low-pressure CVD method and used as the separation layer 1701. It is to be noted that the separation layer 1701 is not limited to silicon and may be formed by using a material which can be selectively removed by etching (For example, W, Mo, or the like). The film thickness of the separation layer 1701 is desirably 50 to 60 nm.

Subsequently, a base insulating film 1702 is formed over the separation layer 1701. The base insulating film 1702 is provided to prevent alkali metal such as Na or alkaline-earth metal contained in the first substrate from diffusing into a semiconductor film and adversely affecting characteristics of a semiconductor element such as a TFT. In addition, the base insulating film 1702 also has a function of protecting a semiconductor element in a subsequent step of separating the semiconductor element. The base insulating film 1702 may have a single layer or multilayer structure stacking a plurality of insulating films. Therefore, the base insulating film 1702 is formed by using an insulating film which can suppress the diffusion of alkali metal or alkaline-earth metal into the semiconductor film, such as silicon oxide, silicon nitride, silicon oxide containing nitrogen (SiON), or silicon nitride containing oxygen (SiNO).

Next, a semiconductor film 1703 is formed over the base insulating film 1702. It is desirable to form the semiconductor film 1703 without being exposed to atmospheric air after forming the base insulating film 1702. The thickness of the semiconductor film 1703 is set to be 20 to 200 nm (desirably 40 to 170 nm, more desirably 50 to 150 nm).

Then, the semiconductor film 1703 is crystallized by being irradiated with a laser beam. A crystalline semiconductor film 1704 is formed by irradiating the semiconductor film 1703 with a laser beam. FIG. 10A is a cross-sectional view showing a scanning process of a laser beam.

Then, the crystalline semiconductor film 1704 is patterned to form island-shaped semiconductor films 1705 to 1707 as shown in FIG. 10B. Thereafter, a gate insulating film 1708 is formed. The gate insulating film 1708 can be formed by using a film including silicon nitride, silicon oxide, silicon oxide containing nitrogen, or silicon nitride containing oxygen as a single layer or a stacked layer by a plasma CVD method, a sputtering method, or the like.

After forming the gate insulating film 1708, heat treatment may be performed at temperatures of 300 to 450° C. for 1 to 12 hours in an atmosphere containing hydrogen by 3 to 100% to hydrogenate the island-shaped semiconductor films 1705 to 1707. In addition, plasma hydrogenation (using hydrogen excited by plasma) may be performed as another means of hydrogenation.

Subsequently, as shown in FIG. 10C, gate electrodes 1709 to 1711 are formed. Here, after Si doped with an impurity which imparts n-type conductivity and W are stacked by a sputtering method, the gate electrodes 1709 to 1711 are formed by etching Si and W using resists 1712 as masks. Obviously, a conductive material, a structure, and a manufacturing method of the gate electrodes 1709 to 1711 are not limited thereto and can be appropriately selected. For example, a stacked structure of Si doped with an impurity which imparts n-type conductivity and NiSi (nickel silicide) or a stacked structure of TaN (tantalum nitride) and W (tungsten) may also be used. In addition, various conductive materials may be formed in a single layer. When the gate electrodes and an antenna are formed concurrently, a material may be selected in consideration of functions thereof.

Moreover, a mask made of SiOx or the like may be used instead of the resist mask. In this case, a step of forming a mask of SiOx, SiON, or the like (referred to as a hard mask) by patterning is added. However, since the film decrease of the mask in the etching is less than that of the resist, the gate electrodes 1709 to 1711 having a desired width can be formed. In addition, the gate electrodes 1709 to 1711 may be selectively formed by a droplet discharge method without using the resists 1712.

After removing the resists 1712, the gate electrodes 1709 to 1711 may be nitrided by using a high-density plasma apparatus. By performing nitriding treatment, circumferences of the gate electrodes 1709 to 1711 are covered with nitride films 1761 to 1766, and a heat resistant property of the gate electrodes can be improved and the gate electrodes can be prevented from being oxidized.

Next, as shown in FIG. 10D, the island-shaped semiconductor film 1706 to be a p-channel TFT is covered with a resist 1713, and the island-shaped semiconductor films 1705 and 1707 are doped with an impurity element which imparts n-type conductivity (typically, P (phosphorus) or As (arsenic)) in a low concentration by using the gate electrodes 1709 and 1711 as masks. In this doping step, doping is performed through the gate insulating film 1708, and pairs of low-concentration impurity regions 1716 and 1717 are formed in the island-shaped semiconductor films 1705 and 1707. It is to be noted that this doping step may be performed without covering the island-shaped semiconductor film 1706 to be the p-channel TFT with the resist.

Then, as shown in FIG. 10E, after removing the resist 1713 by ashing or the like, resists 1718 are newly formed to cover the island-shaped semiconductor films 1705 and 1707 to be n-channel TFTs, and then, the island-shaped semiconductor film 1706 is doped with an impurity element which imparts p-type conductivity (typically B (boron)) in a high concentration by using the gate electrode 1710 as a mask. In this doping step, the doping is performed through the gate insulating film 1708, and a pair of p-type high-concentration impurity regions 1720 is formed in the island-shaped semiconductor film 1706.

Figure 11A:
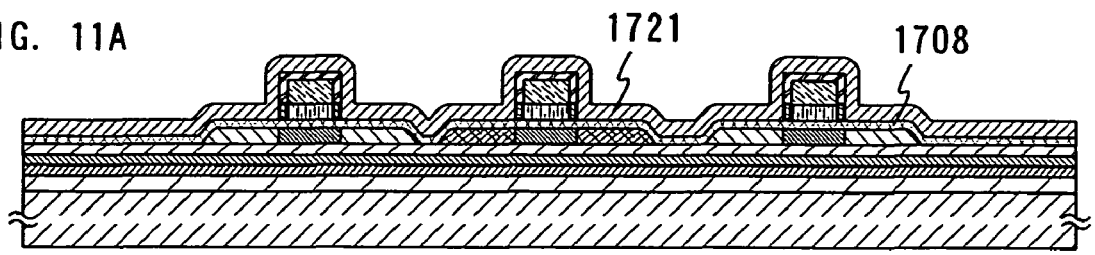
FIGS. 11A to 11C are views each showing a manufacturing step of a semiconductor device according to the present invention.

Subsequently, as shown in FIG. 11A, after removing the resist 1718 by ashing or the like, an insulating film 1721 is formed so as to cover the gate insulating film 1708 and the gate electrodes 1709 to 1711.

Figure 11B:
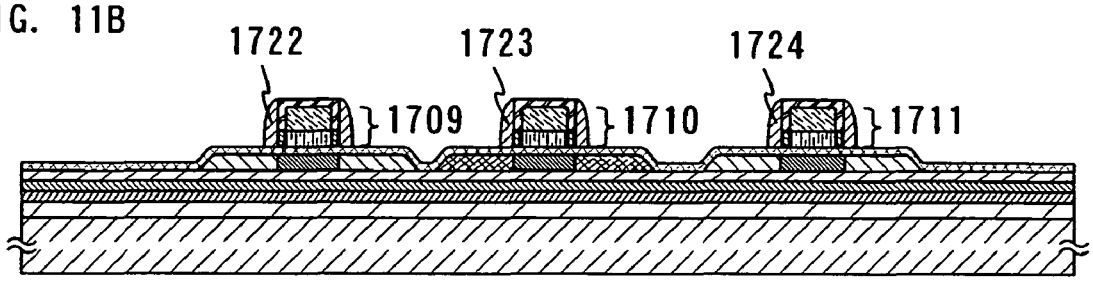

Thereafter, by using an etch back method the insulating film 1721 and the gate insulating film 1708 are partly etched, and sidewalls 1722 to 1724 which are in contact with side surfaces of the gate electrodes 1709 to 1711 are formed in a self-alignment manner as shown in FIG. 11B. As an etching gas, a mixed gas of $CHF_3$ and He is used. It is to be noted that a step of forming a sidewall is not limited thereto.

Figure 11C:
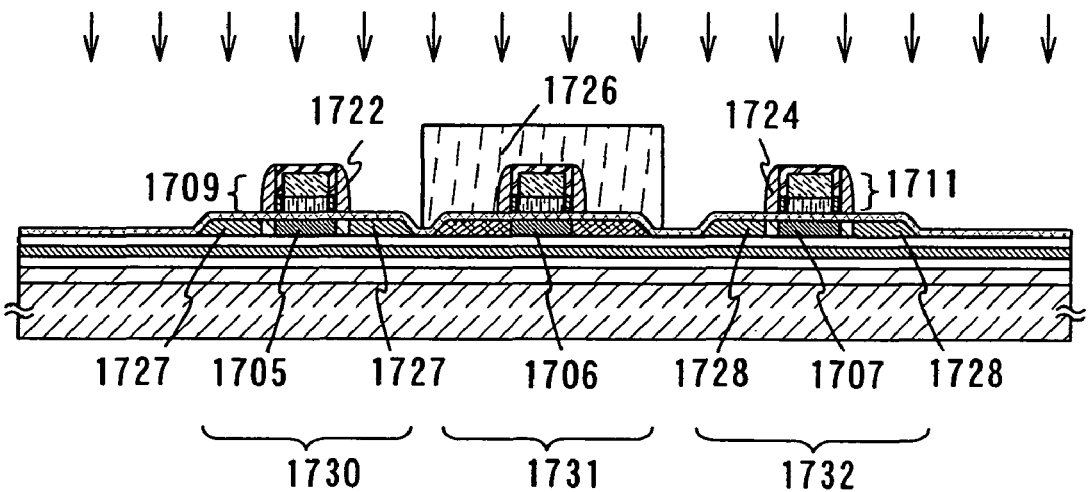

Next, as shown in FIG. 11C, a resist 1726 is newly formed to cover the island-shaped semiconductor film 1706 to be the p-channel TFT, and the island-shaped semiconductor films 1705 and 1707 are doped with an impurity element which imparts n-type conductivity (typically P or As) in a high concentration by using the gate electrodes 1709 and 1711 and the sidewalls 1722 and 1724 as masks. In this doping step, doping is performed through the gate insulating film 1708, and pairs of n-type high-concentration impurity regions 1727 and 1728 are formed in the island-shaped semiconductor films 1705 and 1707.

Then, after removing the resist 1726 by ashing or the like, the impurity regions may be thermally activated. For example, after forming a SiON film of 50 nm thick, heating treatment may be performed at 550° C. for four hours in a nitrogen atmosphere. In addition, when heating treatment is performed at 410° C. for one hour in a nitrogen atmosphere after forming a SiNx film containing hydrogen to be 100 nm thick, a defect in a poly-crystalline semiconductor film can be improved. This is, for example, to terminate dangling bonds in the poly-crystalline semiconductor film and referred to as a hydrogenation step or the like.

Through the above series of steps, an n-channel TFT 1730, a p-channel TFT 1731, and an n-channel TFT 1732 are formed. In the above manufacturing steps, It may adjust the size of the sidewall by appropriately changing a condition of an etch back method. By using the above manufacturing steps, a TFT having a channel length of 0.2 to 2 µm can be formed Further, a passivation film may also be formed to protect the TFTs 1730 to 1732.

Figure 12A:
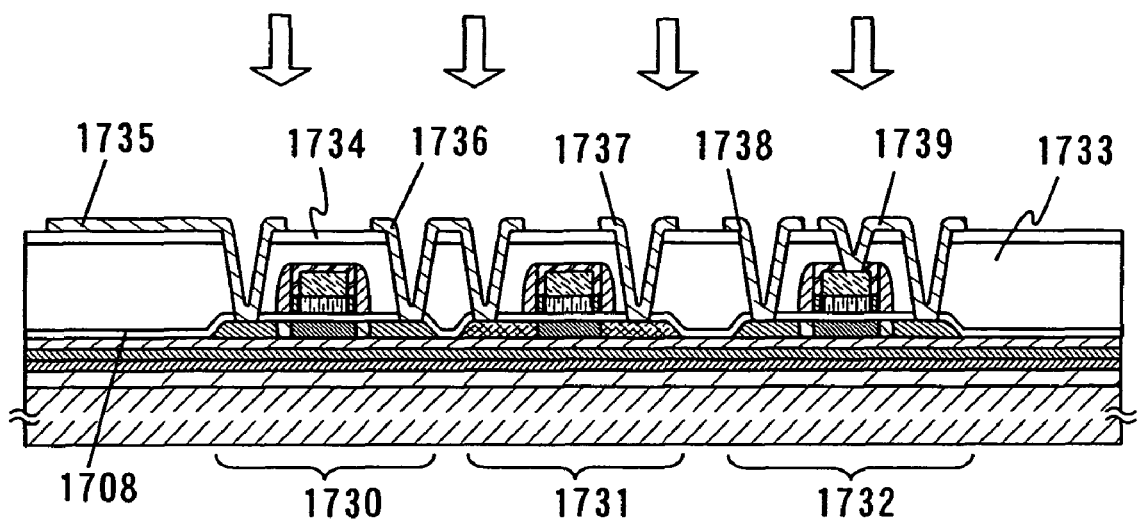
FIGS. 12A and 12B are views each showing a manufacturing step of a semiconductor device according to the present invention.

Subsequently, as shown in FIG. 12A, a first interlayer insulating film 1733 is formed so as to cover the TFTs 1730 to 1732.

Further, a second interlayer insulating film 1734 is formed over the first interlayer insulating film 1733. A filler may be mixed into the first interlayer insulating film 1733 or the second interlayer insulating film 1734 in order to prevent the first interlayer insulating film 1733 or the second interlayer insulating film 1734 from peeling or breaking due to the stress caused by a difference of the coefficient of thermal expansion between a conductive material or the like for forming a wiring that will be formed later and the first interlayer insulating film 1733 or the second interlayer insulating film 1734.

Next, as shown in FIG. 12A, contact holes are formed in the first interlayer insulating film 1733, the second interlayer insulating film 1734, and the gate insulating film 1708, and then, wirings 1735 to 1739 connected to the TFTs 1730 to 1732 are formed. The wirings 1735 and 1736 are connected to the high-concentration impurity regions 1727 of the n-channel TFT 1730, the wirings 1736 and 1737 are connected to the high-concentration impurity regions 1720 of the p-channel TFT 1731, and the wirings 1738 and 1739 are connected to the high-concentration impurity regions 1728 of the n-channel TFT 1732, respectively. Further, the wiring 1739 is also connected to the gate electrode 1711 of the n-channel TFT 1732. The n-channel TFT 1732 can be used as a memory element of a random ROM. Here, nitriding treatment or oxidation treatment may be performed to the wirings 1735 to 1739 by using the high-density plasma apparatus similarly to Embodiment Mode 1.

Figure 12B:
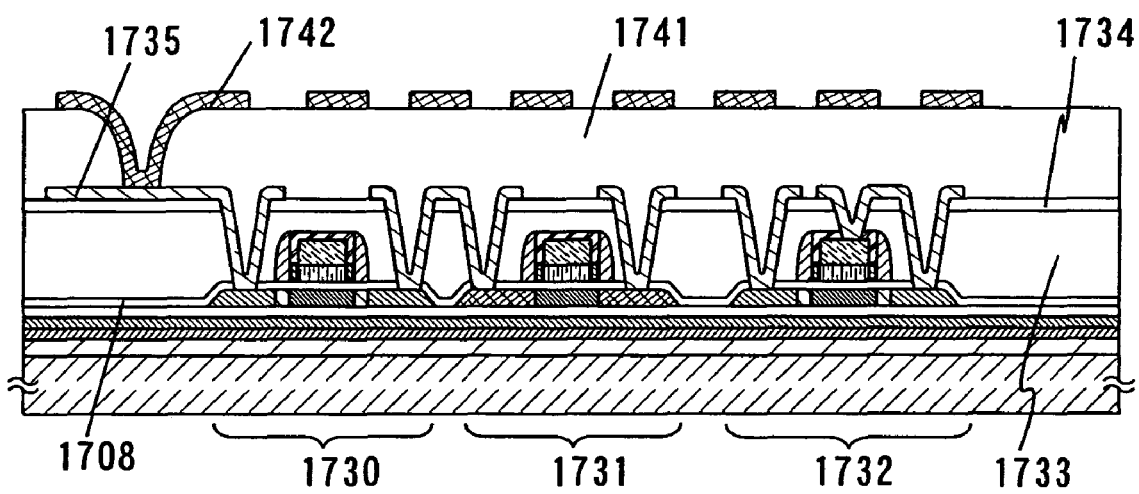

Then, as shown in FIG. 12B, a third interlayer insulating film 1741 is formed over the second interlayer insulating film 1734 so as to cover the wirings 1735 to 1739. The third interlayer insulating film 1741 is formed to have an opening so that a part of the wiring 1735 is exposed. It is to be noted that the third interlayer insulating film 1741 can be formed by using the same material as the first interlayer insulating film 1733.

Subsequently, an antenna 1742 is formed over the third interlayer insulating film 1741. The antenna 1742 can be formed by using a conductive material having one or a plurality of metals or a metal compound, such as Ag, Au, Cu, Pd, Cr, Mo, Ti, Ta, W, Al, Fe, Co, Zn, Sn, and Ni. The antenna 1742 is connected to the wiring 1735. Although the antenna 1742 is directly connected to the wiring 1735 in FIG. 12B, a wireless IC tag of the present invention is not limited to this structure. For example, the antenna 1742 may be electrically connected to the wiring 1735 by using a wiring that is separately formed.

The antenna 1742 can be formed by a printing method, a photolithography method, an evaporation method, a droplet discharge method, or the like. In FIG. 12B, the antenna 1742 is formed by using a single layer conductive film. However, the antenna 1742 can also be formed by stacking a plurality of conductive films. For example, the antenna 1742 may be formed by a wiring formed of Ni or the like which is coated with Cu by electroless plating.

It is to be noted that a droplet discharge method is a method for forming a predetermined pattern by discharging a droplet including a predetermined composition from a small hole. An ink-jet method and the like are included in its category. On the other hand, a printing method includes a screen printing method, an offset printing method, and the like. When a printing method or a droplet discharge method is employed, the antenna 1742 can be formed without using a mask for light exposure. In addition, when a printing method or a droplet discharge method is employed, unlike a photolithography method, a material that will be removed by etching is not necessary. Moreover, since an expensive mask for the light exposure is not necessary, a cost for manufacturing a wireless IC tag can be reduced.

In a case of using a droplet discharge method or various kinds of printing methods, for example, conductive particles of Cu coated with Ag can be used. When the antenna 1742 is formed by a droplet discharge method, it is desirable to perform treatment for improving adhesion of the antenna 1742 to the surface of the third interlayer insulating film 1741.

As a method for improving adhesion, the following methods can be given as specific examples: a method in which metal or a metal compound that can improve adhesion of a conductive film or an insulating film by a catalytic action is attached to the surface of the third interlayer insulting film 1741; a method in which an organic insulating film, metal, or a metal compound having high adhesion to a conductive film or an insulating film to be formed is attached to the surface of the third interlayer insulating film 1741; and a method in which high-density plasma treatment is performed to the surface of the third interlayer insulating film 1741 in atmospheric pressure or reduced pressure so that the surface is reformed. By using a high-density plasma apparatus, the surface can be reformed with less plasma damage.

When metal or a metal compound attached to the third interlayer insulating film 1741 is conductive, sheet resistance thereof is controlled so that a normal operation of the antenna is not interrupted. Specifically, the average thickness of the conductive metal or metal compound may be controlled to be, for example, 1 to 10 nm. In addition, the metal or the metal compound may be insulated partially or wholly by oxidization. Alternatively, the metal or the metal compound attached to the region in which the adhesion is not required to be enhanced may be removed selectively by etching. The metal or the metal compound may be attached selectively only to a particular region by a droplet discharge method, a printing method, a sol-gel method, or the like instead of attaching the metal or the metal compound to the whole surface of the substrate in advance. The metal or the metal compound is not required to be a totally continuous film over the surface of the third interlayer insulating film 1741 but may be dispersed to some extent.

Figure 13A:
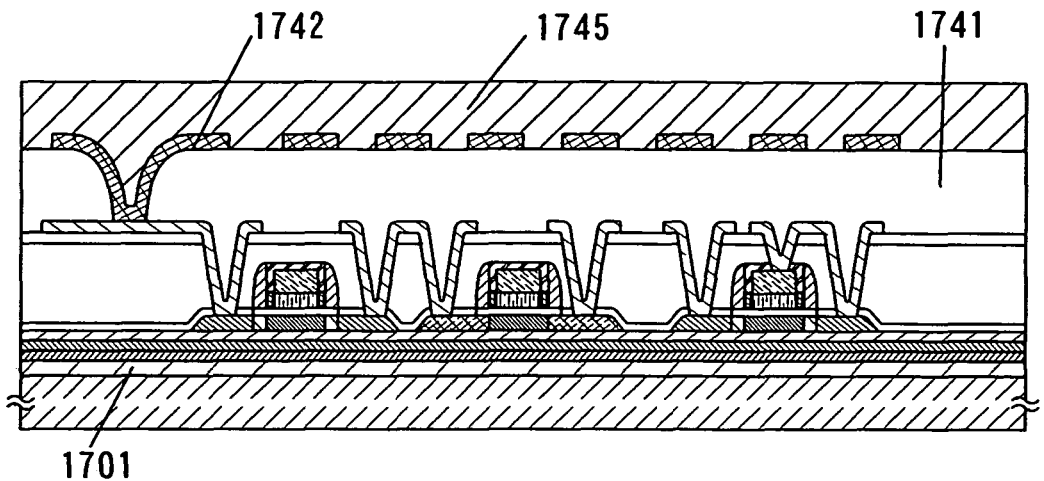
FIGS. 13A to 13C are views each showing a manufacturing step of a semiconductor device according to the present invention.

Then, as shown in FIG. 13A, after forming the antenna 1742, a protective layer 1745 is formed over the third interlayer insulating film 1741 so as to cover the antenna 1742. The protective layer 1745 is formed by using a material which can protect the antenna 1742 when the separation layer 1701 is removed by etching later. For example, the protective layer 1745 can be formed by coating an epoxy resin, an acrylate based resin, or a silicon based resin capable of dissolving in water or alcohols over the entire surface.

Figure 13B:
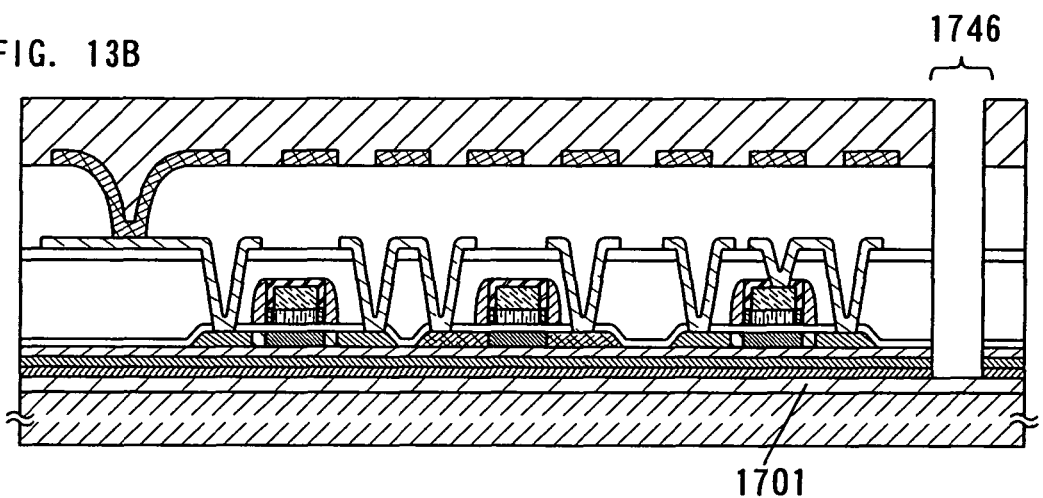

Subsequently, as shown in FIG. 13B, a groove 1746 is formed in order to divide the wireless IC tags. The groove 1746 may have such a depth that the separation layer 1701 is exposed. The groove 1746 can be formed by dicing or scribing. It is to be noted that the groove 1746 is not necessarily formed when it is not required to divide the wireless IC tags formed over the first substrate 1700.

Figure 13C:
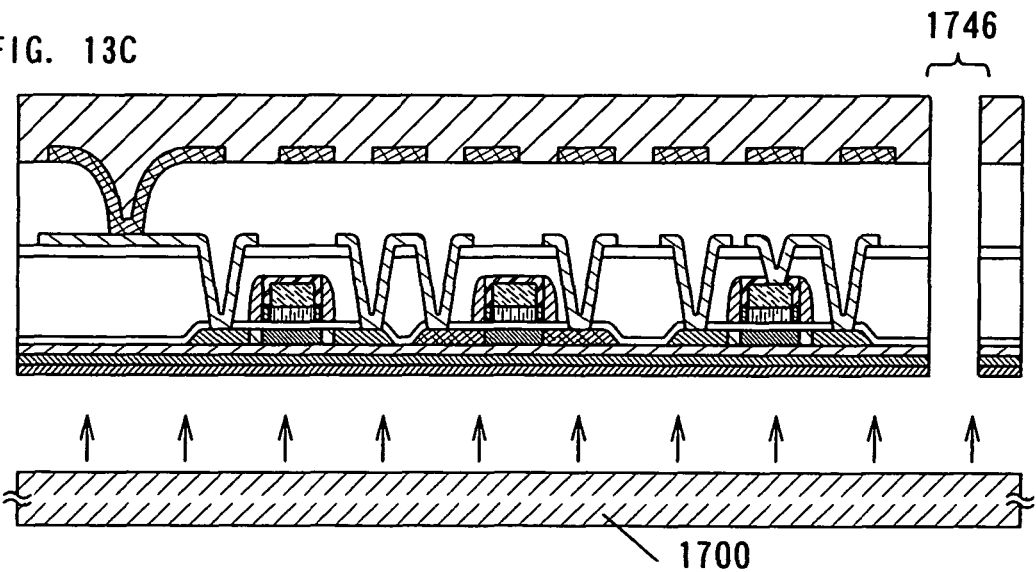

Next, as shown in FIG. 13C, the separation layer 1701 is removed by etching. Here, halogen fluoride is used as an etching gas and introduced from the groove 1746. For example, $ClF_3$ (chlorine trifluoride) is used under a condition where a temperature is 350° C., a flow rate is 300 sccm, a barometric pressure is 798 Pa, and a process time is three hours. In addition, nitrogen may be mixed into the $ClF_3$ gas. The separation layer 1701 can be selectively etched by using halogen fluoride such as $ClF_3$ so that the TFTs 1730 to 1732 can be separated from the first substrate 1700. The halogen fluoride may be either gas or liquid.

Figure 14A:
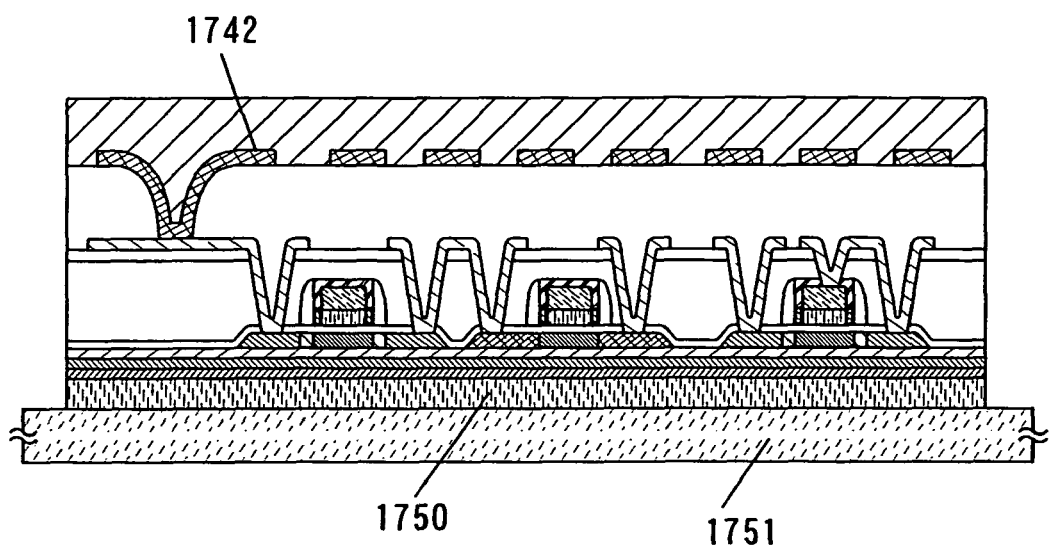
FIGS. 14A and 14B are views each showing a manufacturing step of a semiconductor device according to the present invention.

Then, as shown in FIG. 14A, the separated TFTs 1730 to 1732 and the antenna 1742 are attached to a second substrate 1751 by using an adhesive agent 1750. As the adhesive agent 1750, a material that can be attached to the second substrate 1751 and the base insulating film 1702 is used. The adhesive agent 1750 may be, for example, various curable adhesive agents such as a reactive-curable type, a thermal-curable type, a photo-curable type such as an ultraviolet ray-curable type, and an anaerobic type.

The second substrate 1751 can be formed by a flexible organic material such as paper or a plastic.

Figure 14B:
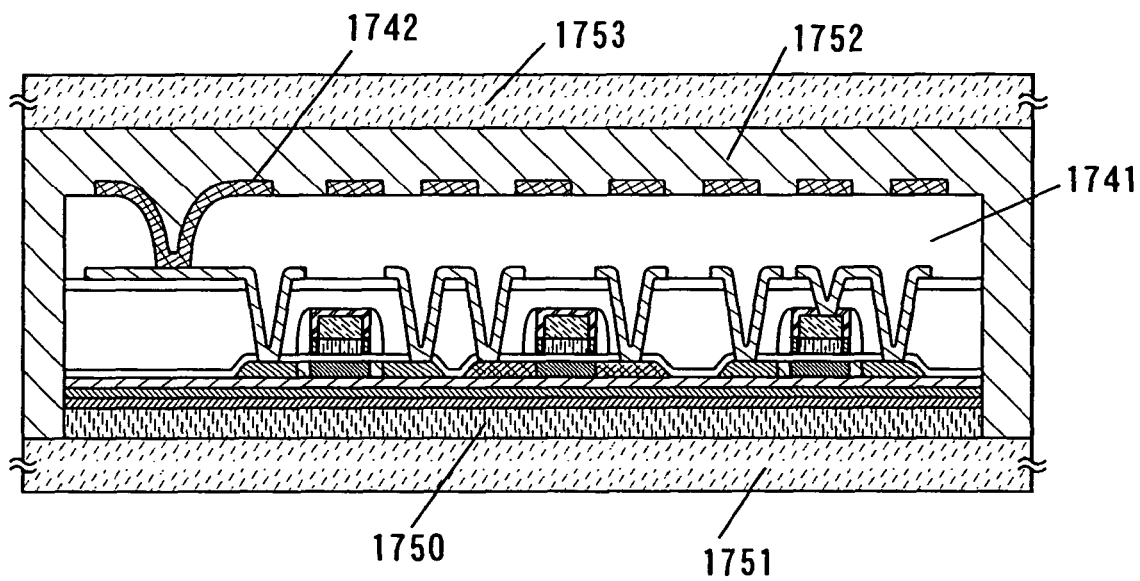

As shown in FIG. 14B, after removing the protective layer 1745, an adhesive agent 1752 is coated over the third interlayer insulating film 1741 so as to cover the antenna 1742, and then a cover member 1753 is attached. A flexible organic material such as paper or a plastic can be used for the cover member 1753 as in the case of the second substrate 1751. The thickness of the adhesive agent 1752 may be 10 to 200 μm, for example.

In addition, as the adhesive agent 1752, a material which can be attached to the cover member 1753, the third interlayer insulating film 1741, and the antenna 1742 is used. The adhesive agent 1752 can be, for example, various curable type adhesive agents such as a reactive-curable type, a thermal-curable type, a photo-curable type such as an ultraviolet ray-curable type, and an anaerobic type.

Through each of the above steps, a wireless IC tag is completed. In accordance with the above manufacturing method, an extremely thin integrated circuit having the total thickness of 0.3 μm or more and 3 μm or less, typically approximately 2 μm, can be formed between the second substrate 1751 and the cover member 1753.

It is to be noted that the thickness of the integrated circuit includes not only the thickness of the semiconductor element itself but also the thicknesses of the various insulating films and interlayer insulating films formed between the adhesive agent 1750 and the adhesive agent 1752. In addition, an area of the integrated circuit in the wireless IC tag can be 5 mm or less square (25 mm² or less), more preferably approximately 0.3 mm (0.09 mm²) to 4 mm (16 mm²) square.

This embodiment mode shows the method in which the separation layer is provided between the first substrate 1700 having a high heat resistant property and the integrated circuit, and the substrate and the integrated circuit are separated by removing the separation layer through etching. However, a method for manufacturing a wireless IC tag of the present invention is not limited to this structure. For example, a metal oxide film may be provided between the substrate having a high heat resistant property and the integrated circuit, and the metal oxide film may be weakened by crystallization so that the integrated circuit is separated. Alternatively, a separation layer formed of an amorphous semiconductor film containing hydrogen may be provided between the substrate having a high heat resistant property and the integrated circuit, and the separation layer may be removed by the laser beam irradiation to separate the substrate and the integrated circuit. Alternatively, the integrated circuit may be separated from the substrate by mechanically removing the substrate having a high heat resistant property with the integrated circuit formed thereover or by removing the substrate by etching using a solution or a gas.

Although this embodiment mode explains the example in which the antenna is formed over the same substrate as the integrated circuit, the present invention is not limited to this structure. An antenna formed over a different substrate and the integrated circuit may be attached afterward so that they are connected electrically.

The frequency of an electric wave usually applied in RFID (Radio Frequency Identification) is mostly 13.56 MHz or 2.45 GHz, and it is highly important to form a wireless IC tag so that the electric waves of these frequencies can be detected in order to enhance the versatility.

The wireless IC tag of this embodiment mode has advantages that the electric wave is not easily blocked compared with an RFID formed by using a semiconductor substrate and attenuation of a signal due to the block of the electric wave can be suppressed. Thus, since a semiconductor substrate is not required to be used, a cost for manufacturing the wireless IC tag can be reduced drastically.

Although this embodiment mode explains the example in which the separated integrated circuit is attached to the flexible substrate, the present invention is not limited to this structure. For example, when the flexible substrate, such as a plastic substrate or the like, having such an allowable temperature limit to resist heat treatment in the manufacturing steps of the integrated circuit like a glass substrate is used, the integrated circuit is not necessarily separated.

By implementing the present invention, a highly reliable thin film integrated circuit or non-contact thin film integrated circuit device can be manufactured, which includes a gate electrode that is nitrided by using a high-density plasma apparatus, and a wiring that is nitrided or oxidized by using the high-density plasma apparatus.

In addition, this embodiment mode can be arbitrarily combined with other embodiment modes.

Embodiment Mode 8

The above embodiment modes show examples of performing high-density plasma treatment when an amorphous semiconductor film, a conductive film, an insulating film, and the like are appropriately stacked. This embodiment mode will describe an example of carrying out the steps as described in the above embodiment modes continuously without exposing to atmospheric air with reference to the drawings.

Figure 16:
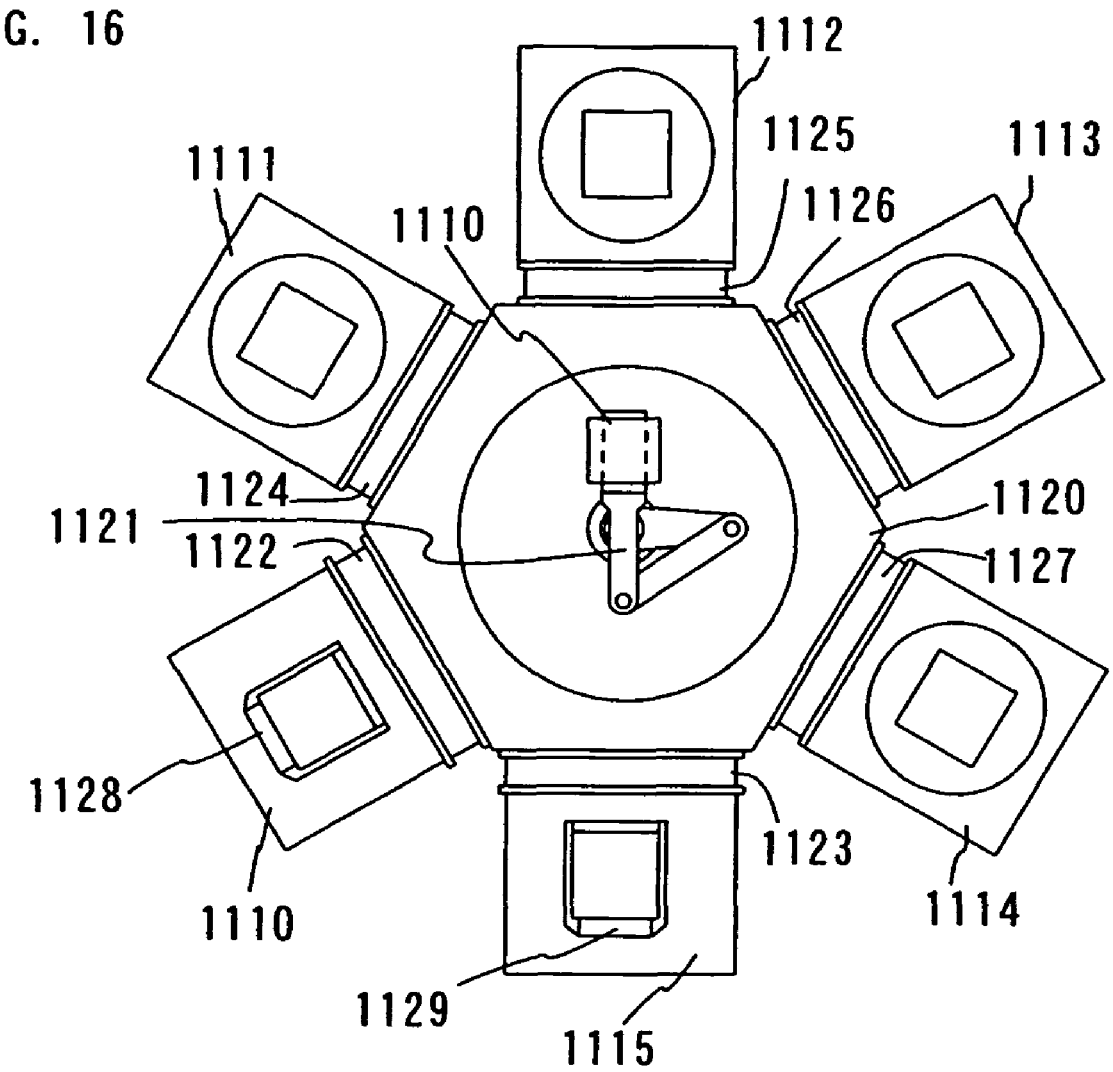
FIG. 16 is a schematic view of a continuous film formation apparatus according to the present invention.

FIG. 16 shows an example of an apparatus provided with a plurality of chambers. It is to be noted that FIG. 16 is a top view of one structure example of the apparatus that is used in this embodiment mode.

The apparatus shown in FIG. 16 has a first chamber 1111, a second chamber 1112, a third chamber 1113, a fourth chamber 1114, load lock chambers 1110 and 1115, and a common chamber 1120. Each chamber has airtightness and is provided with a vacuum evacuation pump and a gas induction system.

The load lock chambers 1110 and 1115 are chambers for carrying a sample (a substrate to be processed) to a system. The first to fourth chambers are chambers to form a conductive film, an insulating film, or a semiconductor film over the substrate or to perform etching, plasma treatment, or the like. The common chamber 1120 is a common chamber for a sample arranged in common to the load lock chambers 1110 and 1115 and the first to fourth chambers. In addition, gate valves 1122 to 1127 are provided between the common chamber 1120 and the load lock chambers 1110 and 1115, and between the common chamber 1120 and the first to forth chambers 1111 to 1114. It is to be noted that a robot arm 1121 is provided in the common chamber 1120, which transfers the substrate to be processed to each chamber.

As a specific example, a part of the manufacturing steps of a TFT described in Embodiment Mode 1 is shown below. Over a substrate having a crystalline semiconductor film, a gate electrode is formed in the first chamber 1111, a resist over the gate electrode is removed in the second chamber 1112, high-density plasma treatment is performed to the surface of the gate electrode in the third chamber 1113, and an insulating film is formed over the gate electrode in the fourth chamber 1114. In this embodiment mode, the high-density plasma treatment apparatus as shown in FIG. 15 is provided in the third chamber 1113.

First, a cassette 1128 containing a plurality of substrates is transferred to the load lock chamber 1110. After the cassette 1128 is transferred therein, a door of the load lock chamber 1110 is closed. In this state, the gate valve 1122 is opened to take out a substrate to be processed from the cassette 1128, and then the substrate is arranged in the common chamber 1120 by the robot arm 1121. Alignment of the substrate is performed in the common chamber 1120 at this time.

Then, the gate valve 1122 is closed and the gate valve 1124 is opened to transfer the substrate to the first chamber 1111. It is to be noted that a semiconductor film, a gate insulating film and the like are formed over the substrate. In addition, a resist pattern which is formed of a photo sensitive material is formed over a conductive film, which is formed over the gate insulating film. In this embodiment mode, molybdenum (Mo) is used as a conductive film. A gate electrode is formed in the first chamber 1111 by etching the conductive film formed over the gate insulating film.

Subsequently, the substrate is taken out to the common chamber 1120 by the robot arm 1121, and transferred to the second chamber 1112. In the second chamber 1112, the photo resist remaining over the gate electrode is removed by ashing or the like.

Subsequently, the substrate is taken out to the common chamber 1120 by the robot arm 1121, and transferred to the third chamber 1113. In the third chamber 1113, the surface of the gate electrode is nitrided by using the high-density plasma apparatus, and a molybdenum nitride film is formed over the surface of the gate electrode.

Subsequently, the substrate is taken out to the common chamber 1120 by the robot arm 1121 and transferred to the fourth chamber 1114. In the fourth chamber 1114, an insulating film is formed over the gate electrode which is nitrided by using a CVD method or the like.

After the insulating film is formed over the gate electrode in this manner, the substrate is transferred to the load lock chamber 1115 by the robot arm 1121 to be stored in a cassette 1129. And then, by forming a contact hole in the insulating film and the gate insulating film and forming a wiring and the like over the insulating film, a semiconductor device as described in the embodiment mode 1 can be manufactured.

It is to be noted that FIG. 16 shows only an example. For example, the number of the chambers may be increased to form a multi layer insulating film with more layers, or the insulating film or the like may be formed by using the high-density plasma apparatus. Components that are not manufactured in the steps shown in this embodiment mode, such as a gate electrode, gate insulating film and the like, may also be formed by this apparatus. In other words, the steps described in Embodiment Modes 1 to 7 can be carried out by arbitrarily combining with the steps in this embodiment mode. FIG. 16 shows an example of employing single type chambers for the first to fourth chambers 1111 to 1114, but a plurality of substrates can also be processed for one time by employing a batch chamber.

By using the apparatus described in this embodiment mode, the gate insulating film, the gate electrode, the gate nitride film, and the like can be continuously formed without being exposed to atmospheric air. Therefore, contaminants can be prevented from being mixed, and productivity can be improved.

Embodiment Mode 9

By using the semiconductor device manufactured by the present invention, various electronic devices can be manufactured. For example, a digital video camera, a digital camera, a goggle type display (a head mount display), a navigation system, an audio reproduction device, a television (display), a mobile terminal and the like can be given. Product quality of the manufactured semiconductor device is favorable so that variation in the product quality can be eliminated. As a result, an electronic device as a final product can be manufactured with high quality. Specific examples are described with reference to the drawings.

Figure 17A:
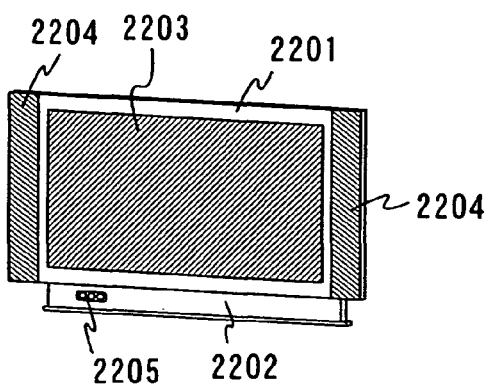
FIGS. 17A to 17F are views showing electronic devices using a semiconductor device manufactured by the present invention.

FIG. 17A shows a display device, which includes a case 2201, a supporting stand 2202, a display portion 2203, speaker portions 2204, a video input terminal 2205, and the like. This display device is manufactured by using a thin film transistor formed by the manufacturing method shown in the other embodiment mode as the display portion 2203. Since reliability of the thin film transistor of the present invention is high, a display device with favorable quality and less variation in quality can be manufactured by using the thin film transistor of the present invention. The display device includes a liquid crystal display device, a light-emitting device, and the like, and specifically includes all the display devices for displaying information for a computer, television reception, advertisement, and the like.

Figure 17B:
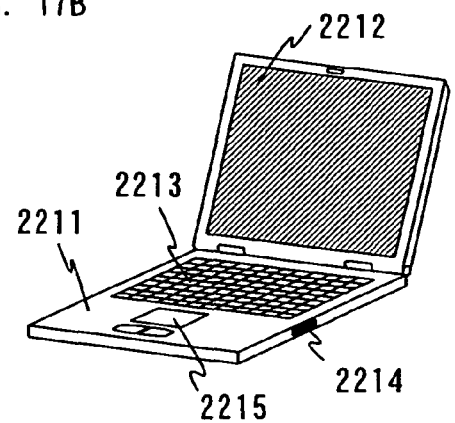

FIG. 17B shows a computer, which includes a case 2211, a display portion 2212, a keyboard 2213, an external connection port 2214, a pointing mouse 2215, and the like. Since reliability of the thin film transistor of the present invention is high, the display portion 2212 and other circuits with favorable quality and less variation in quality can be manufactured by using the thin film transistor of the present invention. Moreover, the present invention can also be applied to a semiconductor device inside a main body such as a CPU or a memory.

Figure 17C:
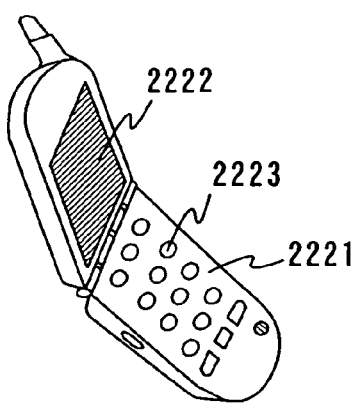

FIG. 17C shows a mobile phone as a typical example of the mobile terminals. This mobile phone includes a case 2221, a display portion 2222, operation keys 2223, and the like. The thin film transistor of the present invention can be used for an electronic device such as a mobile phone as described above, a PDA (personal digital assistant), a digital camera, or a compact game machine. Since reliability of the thin film transistor of the present invention is high, the display portion 2222 and other functional circuits such as a CPU and a memory with favorable quality and less variation in quality can be manufactured by using the thin film transistor of the present invention.

Figure 17D:
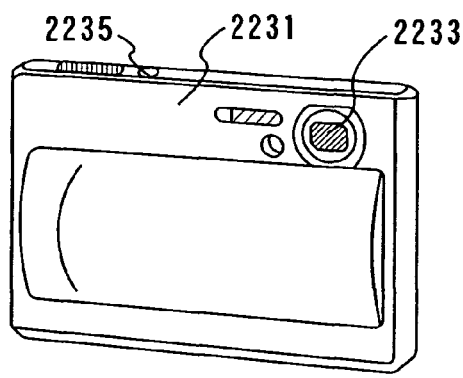
Figure 17E:
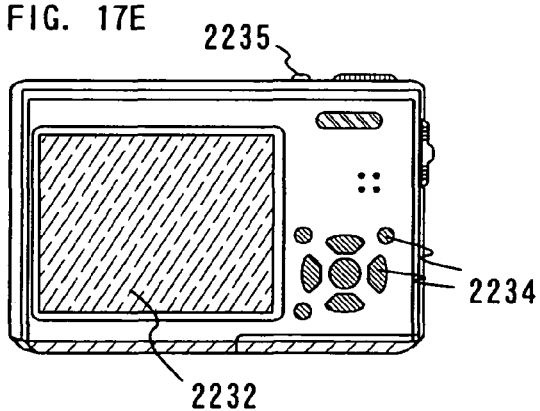

FIGS. 17D and 17E show a digital camera. It is to be noted that FIG. 17E shows a rear side of FIG. 17D. This digital camera includes a case 2231, a display portion 2232, a lens 2233, operation keys 2234, a shutter 2235, and the like. Since reliability of the thin film transistor of the present invention is high, the display portion 2232, a driver portion for controlling the display portion 2232, and other circuits with favorable quality and less variation in quality can be manufactured by using the thin film transistor of the present invention.

Figure 17F:
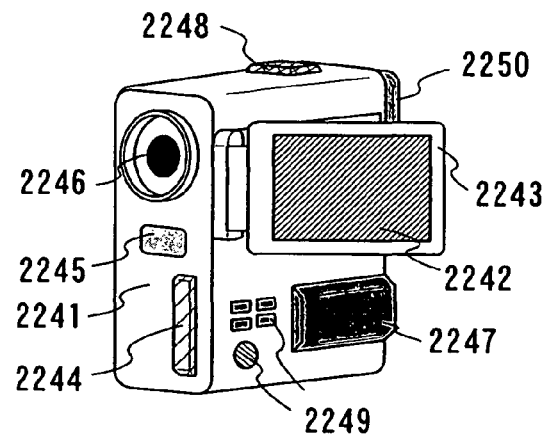

FIG. 17F shows a digital video camera, which includes a main body 2241, a display portion 2242, a case 2243, an external connection port 2244, a remote control receiving portion 2245, an image receiving portion 2246, a battery 2247, an audio input portion 2248, operation keys 2249, an eyepiece portion 2250, and the like. Since reliability of the thin film transistor of the present invention is high, the display portion 2242, a driver portion for controlling the display portion 2242, and other circuits with favorable quality and less variation in quality can be manufactured by using the thin film transistor of the present invention.

A thin film transistor manufactured by using a high-density plasma apparatus of the present invention can also be used for a thin film integrated circuit or a non-contact thin film integrated circuit device (also referred to as a wireless IC tag or an RFID (Radio Frequency Identification)). By applying the manufacturing method shown in the other embodiment modes, the thin film integrated circuit and the non-contact thin film integrated circuit can be used as a tag having a memory.

Figure 18A:
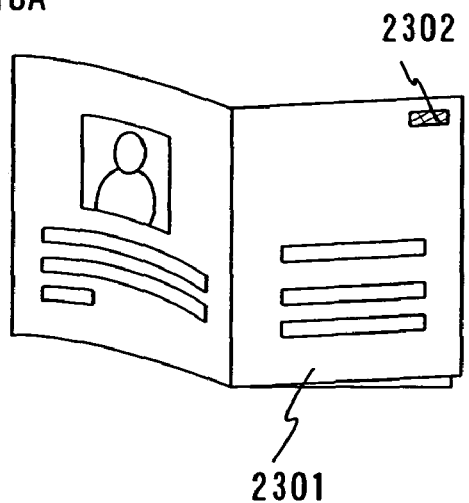
FIGS. 18A and 18B are views showing electronic devices using a semiconductor device manufactured by the present invention.

FIG. 18A shows a passport 2301 to which a wireless IC tag 2302 is attached. The wireless IC tag 2302 may be embedded in the passport 2301. Similarly, the wireless IC tag may be attached to or embedded in various objects such as a driver's license, a credit card, a banknote, a coin, a certificate, a merchandise coupon, a ticket, a traveler's check (T/C), a health insurance card, a residence certificate, and a family register. In this case, only information showing that this product is a real one is inputted into a memory or the like of the wireless IC tag, and access authority is set so that information is not read out or written in illegally. By using the tag as described above, real products can be distinguished from forged ones.

Figure 18B:
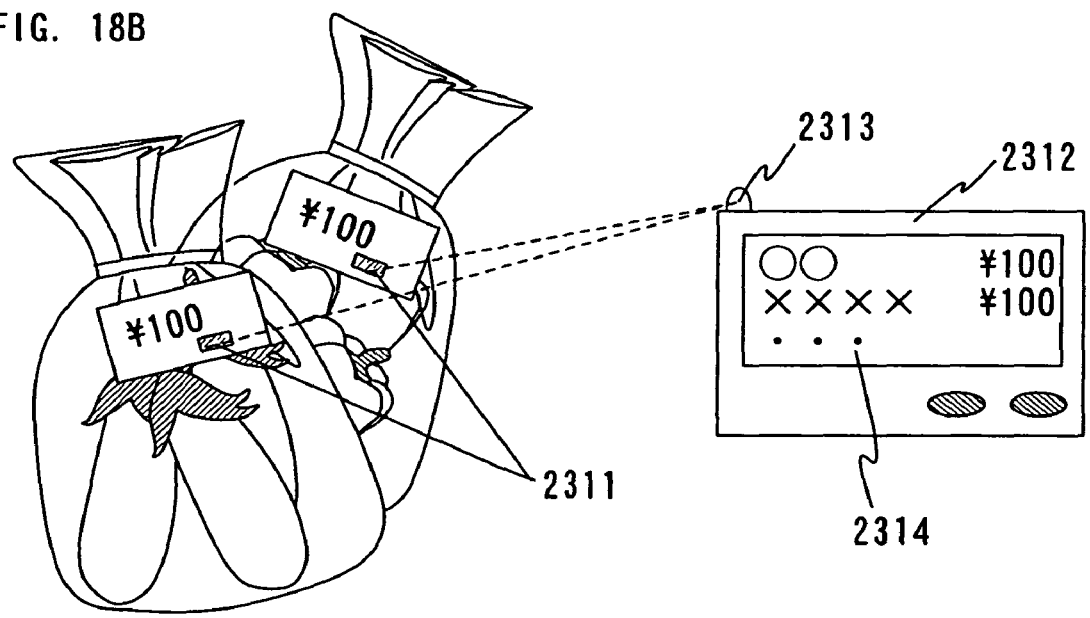

FIG. 18B shows an example of using the wireless IC tag 2311 embedded in a label which is attached to a package of vegetables. The wireless IC tag may also be attached to or embedded in the package itself. The wireless IC tag can also be used for packages of various products without limiting to vegetables. In the wireless IC tag 2311, a production area, a producer, a manufacturing date, a process at the production such as a process method, a circulation process of a product, a price, quantity, an intended purpose, a shape, weight, an expiry date, or other identification information can be stored. The information from the wireless IC tag 2311 can be received by an antenna portion 2313 of a wireless reader 2312 and read out, and displayed on a display portion 2314 of the reader 2312. Thus, wholesalers, retailers, and consumers can know such information easily. Further, by setting the access authority for each of the producers, the traders, and the consumers, those who do not own the access authority cannot read, write, rewrite, and erase the information.

The wireless IC tag can be used as follows. At the settlement, information that the settlement has been made is written in the wireless IC tag, and the wireless IC tag is checked by a checking means provided at an exit whether or not the information that the settlement has been made is written in the wireless IC tag. If the IC tag is brought out from the store without making the settlement, the alarm rings. With this method, forgetting of the settlement and shoplifting can be prevented.

In consideration of protecting customer's privacy, the following method is also possible. At the settlement at a cash register, any of the followings is conducted; (1) data inputted in the wireless IC tag are locked by pin numbers or the like, (2) data itself inputted in the wireless IC tag are encrypted, (3) data inputted in the wireless IC tag are erased, and (4) data inputted in the wireless IC tag are destroyed. Then, a checking means is provided at an exit, and whether any one of (1) to (4) has been conducted or whether the data in the wireless IC tag are not processed is checked so that whether the settlement has been made or not is checked. In this way, whether the settlement has been made or not can be checked in the store, and reading out the information in the wireless IC tag against the owner's will outside the store can be prevented.

Several methods can be given to destroy the data inputted in the wireless IC tag of (4). For example, the followings are given: (a) a method in which only the data are destroyed by writing one or both of "0" (off) and "1" (on) in at least a portion of the electronic data in the wireless IC tag and (b) a method in which an excessive amount of current is flowed through the wireless IC tag to physically destroy a part of a wiring of a semiconductor element in the wireless IC tag.

Since the wireless tags mentioned above require much higher manufacturing cost than the conventionally used barcodes, the cost reduction is necessary. In accordance with the present invention, however, semiconductor elements with favorable quality and no variation in quality can be formed with high throughput, which is effective for the cost reduction. Further, the wireless tags can be manufactured with high quality so as to have no variation in performance.

As described above, an applicable range of the semiconductor device manufactured by the present invention is extremely wide, and the semiconductor device manufactured by the present invention can be applied to electronic devices in various fields.

This application is based on Japanese Patent Application serial no. 2005-133688 filed on Apr. 28, 2005, in Japan Patent Office, the entire contents of which are hereby incorporated by reference.

What is claimed is:

1. A method for manufacturing a semiconductor device, comprising the steps of:
    forming a semiconductor film over a substrate having an insulated surface;
    forming a gate insulating film over the semiconductor film;
    forming a gate electrode over the gate insulating film;
    forming a nitride film over a surface of the gate electrode by nitriding the surface of the gate electrode by high-density plasma;
    forming a transparent conductive film over the nitride film; and
    nitriding a surface of the transparent conductive film by high-density plasma.

2. The method for manufacturing a semiconductor device according to claim 1 further comprising:
    forming an insulating film over the gate electrode;
    forming a wiring over the insulating film; and
    forming a metal nitride film over a surface of the wiring by nitriding the surface of the wiring by high-density plasma.

3. The method for manufacturing a semiconductor device according to claim 1 further comprising:

forming an insulating film over the gate electrode;
forming a wiring over the insulating film; and
forming a metal oxide film over a surface of the wiring by oxidizing the surface of the wiring by high-density plasma.

4. A method for manufacturing a semiconductor device, comprising the steps of:
forming a semiconductor film over a substrate having an insulated surface;
forming a gate insulating film over the semiconductor film;
forming a gate electrode over the gate insulating film;
forming a nitride film over a surface of the gate electrode by nitriding the surface of the gate electrode by high-density plasma;
forming an insulating film over the gate electrode;
forming a wiring over the insulating film;
forming a transparent conductive film over the second insulating film; and
nitriding a surface of the transparent conductive film by high-density plasma.

5. A method for manufacturing a semiconductor device, comprising the steps of:
forming a semiconductor film over a substrate having an insulated surface;
forming a gate insulating film over the semiconductor film;
forming a gate electrode over the gate insulating film;
forming a nitride film over a surface of the gate electrode by nitriding the surface of the gate electrode by high-density plasma;
forming an insulating film over the gate electrode;
forming a wiring over the insulating film;
forming a transparent conductive film over the second insulating film; and
oxidizing a surface of the transparent conductive film by high-density plasma.

6. A method for manufacturing a semiconductor device, comprising the steps of:
forming a semiconductor film over a substrate having an insulated surface;
forming a gate insulating film over the semiconductor film;
forming a gate electrode over the gate insulating film;
forming an insulating film over the gate electrode;
forming a wiring over the insulating film;
forming a metal nitride film over a surface of the wiring by nitriding the surface of the wiring by high-density plasma;
forming a transparent conductive film over the metal nitride film; and
nitriding a surface of the transparent conductive film by high-density plasma.

7. A method for manufacturing a semiconductor device, comprising the steps of:
forming a semiconductor film over a substrate having an insulated surface;
forming a gate insulating film over the semiconductor film;
forming a gate electrode over the gate insulating film;
forming an insulating film over the gate electrode;
forming a wiring over the insulating film;
forming a metal oxide film over a surface of the wiring by oxidizing the surface of the wiring by high-density plasma;
forming a transparent conductive film over the metal oxide film; and
nitriding a surface of the transparent conductive film by high-density plasma.

8. A method for manufacturing a semiconductor device, comprising the steps of:
forming a semiconductor film over a substrate having an insulated surface;
forming a gate insulating film over the semiconductor film;
forming a gate electrode over the gate insulating film;
forming an insulating film over the gate electrode;
forming a wiring over the insulating film;
forming a transparent conductive film over the wiring; and
nitriding a surface of the transparent conductive film by high-density plasma.

9. A method for manufacturing a semiconductor device, comprising the steps of:
forming a semiconductor film over a substrate having an insulated surface;
forming a gate insulating film over the semiconductor film;
forming a gate electrode over the gate insulating film;
forming an insulating film over the gate electrode;
forming a wiring over the insulating film;
forming a transparent conductive film over the wiring; and
oxidizing a surface of the transparent conductive film by high-density plasma.

10. A method for manufacturing a semiconductor device, comprising the steps of:
forming a semiconductor film over a substrate having an insulated surface;
forming a gate insulating film over the semiconductor film;
forming a gate electrode over the gate insulating film;
forming an insulating film over the gate electrode;
forming a wiring over the insulating film;
forming a transparent conductive film over the wiring;
nitriding a surface of the transparent conductive film by high-density plasma; and
cleaning the surface of the transparent conductive film.

11. A method for manufacturing a semiconductor device, comprising the steps of:
forming a semiconductor film over a substrate having an insulated surface;
forming a gate insulating film over the semiconductor film;
forming a gate electrode over the gate insulating film;
forming an insulating film over the gate electrode;
forming a wiring over the insulating film;
forming a transparent conductive film over the wiring;
oxidizing a surface of the transparent conductive film by high-density plasma; and
cleaning the surface of the transparent conductive film.

12. The method for manufacturing a semiconductor device according to claim 1, wherein a mixed gas of nitrogen and a rare gas, a mixed gas of ammonia and a rare gas, or a mixed gas of nitrogen, hydrogen, and a rare gas is used in at least one of nitriding by using the high-density plasma.

13. The method for manufacturing a semiconductor device according to claim 6, wherein a mixed gas of nitrogen and a rare gas, a mixed gas of ammonia and a rare gas, or a mixed gas of nitrogen, hydrogen, and a rare gas is used in at least one of nitriding by using the high-density plasma.

14. The method for manufacturing a semiconductor device according to claim 7, wherein a mixed gas of oxygen and a rare gas, or a mixed gas of oxygen, hydrogen, and a rare gas is used in oxidation by using the high-density plasma.

15. The method for manufacturing a semiconductor device according to claim 8, wherein a mixed gas of nitrogen and a rare gas, a mixed gas of ammonia and a rare gas, or a mixed gas of nitrogen, hydrogen, and a rare gas is used in nitriding by using the high-density plasma.

16. The method for manufacturing a semiconductor device according to claim 9, wherein a mixed gas of oxygen and a rare gas, or a mixed gas of oxygen, hydrogen, and a rare gas is used in oxidation by using the high-density plasma.

17. The method for manufacturing a semiconductor device according to claim 10, wherein a mixed gas of nitrogen and a rare gas, a mixed gas of ammonia and a rare gas, or a mixed gas of nitrogen, hydrogen, and a rare gas is used in nitriding by using the high-density plasma.

18. The method for manufacturing a semiconductor device according to claim 11, wherein a mixed gas of oxygen and a rare gas, or a mixed gas of oxygen, hydrogen, and a rare gas is used in oxidation by using the high-density plasma.

19. The method for manufacturing a semiconductor device according to claim 1, wherein the substrate is heated to temperatures of 200 to 550° C. in at least one of nitriding by using the high-density plasma.

20. The method for manufacturing a semiconductor device according to claim 6, wherein the substrate is heated to temperatures of 200 to 550° C. in at least one of nitriding by using the high-density plasma.

21. The method for manufacturing a semiconductor device according to claim 7, wherein the substrate is heated to temperatures of 200 to 550° C. in oxidation by using the high-density plasma.

22. The method for manufacturing a semiconductor device according to claim 8, wherein the substrate is heated to temperatures of 200 to 550° C. in nitriding by using the high-density plasma.

23. The method for manufacturing a semiconductor device according to claim 9, wherein the substrate is heated to temperatures of 200 to 550° C. in oxidation by using the high-density plasma.

24. The method for manufacturing a semiconductor device according to claim 10, wherein the substrate is heated to temperatures of 200 to 550° C. in nitriding by using the high-density plasma.

25. The method for manufacturing a semiconductor device according to claim 11, wherein the substrate is heated to temperatures of 200 to 550° C. in oxidation by using the high-density plasma.

26. The method for manufacturing a semiconductor device according to claim 1, wherein at least one of the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

27. The method for manufacturing a semiconductor device according to claim 6, wherein at least one of the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

28. The method for manufacturing a semiconductor device according to claim 7, wherein at least one of the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

29. The method for manufacturing a semiconductor device according to claim 8, wherein the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

30. The method for manufacturing a semiconductor device according to claim 9, wherein the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

31. The method for manufacturing a semiconductor device according to claim 10, wherein the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

32. The method for manufacturing a semiconductor device according to claim 11, wherein the high-density plasma has electron temperatures of 0.5 eV or higher and 1.5 eV or lower, and has electron density of $1.0 \times 10^{11}$ cm$^{-3}$ or higher and $1.0 \times 10^{13}$ cm$^{-3}$ or lower.

33. The method for manufacturing a semiconductor device according to claim 1, wherein a material for the gate electrode is one selected from the group consisting of molybdenum, tungsten, chromium, tantalum, aluminum and silicon.

34. The method for manufacturing a semiconductor device according to claim 6, further comprising steps of:
forming a contact hole in the insulating film using a resist as a mask; and
performing a high-density plasma treatment to the resist and the insulating film to form a film over a side surface and a bottom surface of the contact hole.

35. The method for manufacturing a semiconductor device according to claim 7, further comprising steps of:
forming a contact hole in the insulating film using a resist as a mask; and
performing a high-density plasma treatment to the resist and the insulating film to form a film over a side surface and a bottom surface of the contact hole.

36. The method for manufacturing a semiconductor device according to claim 8, further comprising steps of:
forming a contact hole in the insulating film using a resist as a mask; and
performing a high-density plasma treatment to the resist and the insulating film to form a film over a side surface and a bottom surface of the contact hole.

37. The method for manufacturing a semiconductor device according to claim 9, further comprising steps of:
forming a contact hole in the insulating film using a resist as a mask; and
performing a high-density plasma treatment to the resist and the insulating film to form a film over a side surface and a bottom surface of the contact hole.

38. The method for manufacturing a semiconductor device according to claim 10, further comprising steps of:
forming a contact hole in the insulating film using a resist as a mask; and
performing a high-density plasma treatment to the resist and the insulating film to form a film over a side surface and a bottom surface of the contact hole.

39. The method for manufacturing a semiconductor device according to claim 11, further comprising steps of:
forming a contact hole in the insulating film using a resist as a mask; and
performing a high-density plasma treatment to the resist and the insulating film to form a film over a side surface and a bottom surface of the contact hole.

40. The method for manufacturing a semiconductor device according to claim 1, wherein the gate electrode comprises molybdenum.

41. The method for manufacturing a semiconductor device according to claim 4, wherein the gate electrode comprises molybdenum.

42. The method for manufacturing a semiconductor device according to claim 5, wherein the gate electrode comprises molybdenum.

43. The method for manufacturing a semiconductor device according to claim 6, wherein the gate electrode comprises molybdenum.

44. The method for manufacturing a semiconductor device according to claim 7, wherein the gate electrode comprises molybdenum.

45. The method for manufacturing a semiconductor device according to claim 8, wherein the gate electrode comprises molybdenum.

46. The method for manufacturing a semiconductor device according to claim 9, wherein the gate electrode comprises molybdenum.

47. The method for manufacturing a semiconductor device according to claim 10, wherein the gate electrode comprises molybdenum.

48. The method for manufacturing a semiconductor device according to claim 11, wherein the gate electrode comprises molybdenum.

* * * * *